(12) United States Patent
Namekawa

(10) Patent No.: US 11,601,037 B2
(45) Date of Patent: Mar. 7, 2023

(54) RECTANGULAR-WAVE-SIGNAL GENERATING CIRCUIT AND SWITCHING POWER SUPPLY

(71) Applicants: Kabushiki Kaisha Toshiba, Tokyo (JP); Toshiba Electronic Devices & Storage Corporation, Tokyo (JP)

(72) Inventor: Toshimasa Namekawa, Ota Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 67 days.

(21) Appl. No.: 17/018,280

(22) Filed: Sep. 11, 2020

(65) Prior Publication Data

US 2021/0091656 A1 Mar. 25, 2021

(30) Foreign Application Priority Data

Sep. 19, 2019 (JP) .............................. JP2019-170801

(51) Int. Cl.
  *H02M 1/08* (2006.01)
  *H03K 4/83* (2006.01)
  *H03K 3/037* (2006.01)
  *H02M 3/156* (2006.01)

(52) U.S. Cl.
  CPC ............. *H02M 1/08* (2013.01); *H02M 3/156* (2013.01); *H03K 3/037* (2013.01); *H03K 4/83* (2013.01)

(58) Field of Classification Search
  None
  See application file for complete search history.

(56) References Cited

U.S. PATENT DOCUMENTS

| 7,348,812 | B2 | 3/2008 | Ikezawa | |
| 7,795,952 | B2* | 9/2010 | Lui | ........................ H02M 3/07 |
| | | | | 363/60 |
| 7,872,456 | B2* | 1/2011 | Li | ....................... H02M 3/1588 |
| | | | | 323/283 |
| 9,985,549 | B2 | 5/2018 | Namekawa | |
| 10,186,993 | B2* | 1/2019 | Chen | ....................... H02P 6/085 |

(Continued)

FOREIGN PATENT DOCUMENTS

| JP | 2003-152508 A | 5/2003 |
| JP | 2006-50310 A | 2/2006 |

(Continued)

*Primary Examiner* — Jeffrey A Gblende
(74) *Attorney, Agent, or Firm* — Allen & Overy LLP

(57) ABSTRACT

A rectangular-wave-signal generating circuit according to an embodiment comprises: a sawtooth-wave output circuit; a first detector; a second detector; and a first PWM-signal output circuit. The sawtooth-wave output circuit is configured to generate and output a sawtooth-wave signal synchronized with a clock signal. The first detector is configured to detect a first timing at which a potential of the sawtooth-wave signal exceeds a bottom potential. The second detector is configured to detect a second timing at which a potential of the sawtooth-wave signal exceeds a potential of a first pulse-width instruction voltage signal. The first PWM-signal output circuit is configured to generate a first PWM signal based on a time difference between the first timing and the second timing.

15 Claims, 16 Drawing Sheets

(56) References Cited

U.S. PATENT DOCUMENTS

| | | | | |
|---|---|---|---|---|
| 10,797,588 B2* | 10/2020 | Yasuda | ............... | H02M 1/36 |
| 10,862,397 B2* | 12/2020 | Liu | .................. | H02M 1/32 |
| 2020/0304034 A1 | 9/2020 | Namekawa | | |

FOREIGN PATENT DOCUMENTS

| | | |
|---|---|---|
| JP | 3951674 B2 | 8/2007 |
| JP | 3965171 B2 | 8/2007 |
| JP | 2009-118362 A | 5/2009 |
| JP | 2013-55794 A | 3/2013 |
| JP | 2017-55627 A | 3/2017 |
| JP | 2019-052950 A | 4/2019 |
| JP | 2020-156215 A | 9/2020 |

\* cited by examiner

RECTANGULAR-WAVE-SIGNAL GENERATING CIRCUIT AND SWITCHING POWER SUPPLY

CROSS-REFERENCE TO RELATED APPLICATIONS

This application is based upon and claims the benefit of priority from Japanese Patent Application No. 2019-170801, filed on Sep. 19, 2019; the entire contents of which are incorporated herein by reference.

FIELD

Embodiments of the present invention relate to a rectangular-wave-signal generating circuit and a switching power supply.

BACKGROUND

With increase of the speed of a computer and improvement of the accuracy of an electronic control motor, the demand for stability of an output power-supply voltage of a constant-voltage stabilized power supply is becoming severe. At the same time, an output current to be required is increased, and the demand for high efficiency is also increased. For example, in a recent computer, there is required a stabilized power supply that outputs a power of 1 V (volt) and a maximum current of 60 A (ampere) from a power supply of 24 V. Further, in applications of an electronic control motor, there is required a power supply that converts a wide range of input voltages from 10 to 40 V into a power of 20 V and a maximum current of 3 A, for example, and stably outputs it.

A high-efficiency switching power supply is commonly used as a power supply for handling such relatively large power. However, in general, it has been difficult to stably operate a switching power supply capable of performing a buck operation with a high step-down ratio of one tenth or less, or a switching power supply capable of performing a buck-boost operation that allows a wide input power-supply voltage range, for example.

DETAILED DESCRIPTION

Figure 1:
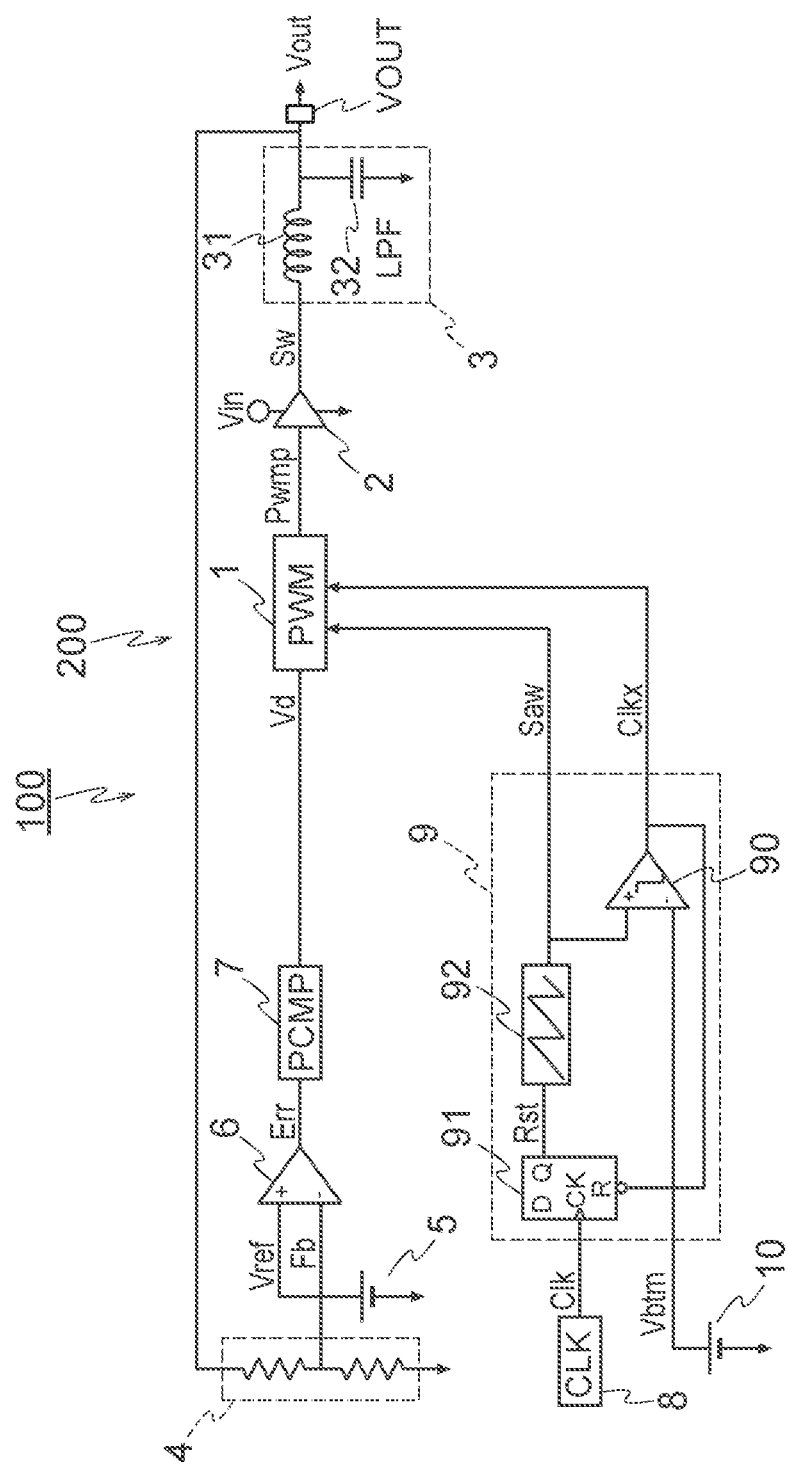
FIG. 1 is a diagram illustrating a configuration example of a switching power supply according to a first embodiment.

A rectangular-wave-signal generating circuit according to an embodiment comprises: a sawtooth-wave output circuit; a first detector; a second detector; and a first PWM-signal output circuit. The sawtooth-wave output circuit is configured to generate and output a sawtooth-wave signal synchronized with a clock signal. The first detector is configured to detect a first timing at which a potential of the sawtooth-wave signal exceeds a bottom potential. The second detector is configured to detect a second timing at which a potential of the sawtooth-wave signal exceeds a potential of a first pulse-width instruction voltage signal. The first PWM-signal output circuit is configured to generate a first PWM signal based on a time difference between the first timing and the second timing.

Embodiments of the present invention will now be explained in detail with reference to the accompanying drawings. In the drawings accompanying this specification, for the conveniences of illustration and easier understanding, the scales, horizontal and vertical sizes, and the like of constituent elements are illustrated in a modified or exaggerated manner with regard to actual products.

FIG. 1 is a diagram illustrating a configuration example of a switching power supply 100 according to a first embodiment.

The switching power supply 100 is a device that controls an input power-supply voltage Vin supplied from an input power supply and outputs an output power-supply voltage Vout from an output power-supply voltage terminal VOUT. The ratio of the input power-supply voltage Vin and the output power-supply voltage Vout in the switching power supply 100 is a high step-down ratio of one tenth or less, for example. The switching power supply 100 may be used for a control computer, a steering motor, or the like which constitutes an automatic driving device for an automobile.

The switching power supply 100 includes a PWM (Pulse Width Modulation) circuit 1, a switching driver 2, an LC low-pass filter 3, a voltage divider 4, a reference voltage source 5, an error amplifier 6, a PCMP circuit (Phase Compensation circuit) 7, a clock oscillator (CLK) 8, a sawtooth wave generator 9, and a reference voltage source 10. The sawtooth wave generator 9 includes a voltage detector 90, a reset control circuit 91, and a sawtooth wave generator 92. FIG. 1 further illustrates a clock signal Clk, a bottom potential Vbtm, a synchronous clock signal Clkx, a sawtooth-wave signal Saw, a feedback signal Fb, a reference voltage Vref, an error signal Err, a duty-instruction voltage signal Vd, a reset signal Rst, a switching signal Sw, and a PWM signal Pwmp. The sawtooth wave generator 9 is a circuit that outputs the sawtooth-wave signal Saw having high linearity. A rectangular-wave-signal generating circuit 200 according to the present embodiment is configured by the PWM circuit 1 and the sawtooth wave generator 9 having high linearity.

The duty-instruction voltage signal Vd, the sawtooth-wave signal Saw, and the synchronous clock signal Clkx are input to the PWM circuit 1 that in turn outputs the PWM signal Pwmp synchronized with the synchronous clock signal Clkx. The sawtooth-wave signal Saw is a sawtooth wave that has a higher potential than the bottom potential Vbtm and has linearity. In other words, the bottom potential Vbtm is set based on linear characteristics of the sawtooth-wave signal Saw having high linearity.

The PWM signal Pwmp is a rectangular wave. That is, the PWM circuit 1 sets the PWM signal Pwmp to Hi at a first timing at which the synchronous clock signal Clkx becomes Hi, and resets the PWM signal Pwmp to Low at a second timing at which the potential of the sawtooth-wave signal Saw becomes higher than the potential of the duty-instruction voltage signal Vd. In the present embodiment, a high potential is represented as "Hi" and a low potential is represented as "Low".

The switching driver 2 receives the PWM signal Pwmp from the PWM circuit 1 as its input, and connects the input power supply and the LC low-pass filter 3 with a low resistance when the PWM signal Pwmp is Hi. Meanwhile, when the PWM signal Pwmp is Low, the switching driver 2 connects a grounding power supply and the LC low-pass filer 3 with a low resistance. That is, the switching driver 2 outputs the switching signal Sw having a pulse-like waveform to the LC low-pass filter 3 based on the PWM signal Pwmp. In this manner, a Hi-duration of the PWM signal Pwmp corresponds to an on-duration of a switching operation by the switching driver 2. Accordingly, the output power-supply voltage Vout is reduced with reduction of the Hi-duration of the PWM signal Pwmp. The switching driver 2 corresponds to a switching circuit portion.

The LC low-pass filter 3 is configured by an inductor 31 and a smoothing capacitor 32. The inductor 31 is connected to the switching driver 2 at one terminal and to the output terminal VOUT and one end of the smoothing capacitor 32 at the other terminal. The other end of the smoothing capacitor 32 is connected to the grounding power supply. Thus, a supplied potential is smoothed by the smoothing capacitor 32 and is output as the output power-supply voltage Vout. In this manner, the LC low-pass filter 3 converts the switching signal Sw to a direct-current signal and outputs the output power-supply voltage Vout. The LC low-pass filter 3 corresponds to a smoothing circuit portion.

The voltage divider 4 divides the output power-supply voltage Vout to generate the feedback signal Fb. The reference voltage source 5 outputs the reference voltage Vref.

The error amplifier 6 is connected to the voltage divider 4 at an inverting differential input terminal and to the reference voltage source 5 at a non-inverting differential input terminal. That is, the error amplifier 6 receives the feedback signal Fb at the inverting differential input terminal as one input and the reference voltage Vref at the non-inverting differential input terminal as another input, and amplifies a potential difference between these inputs to output the error signal Err.

The PCMP 7 is connected to the error amplifier 6 at an input terminal and to the PWM circuit 1 at an output terminal. Accordingly, the PCMP 7 receives the error signal Err as its input and outputs the duty-instruction voltage signal Vd. An error amplifier circuit is configured by the voltage divider 4, the error amplifier 6, and the PCMP 7.

The CLK 8 generates the clock signal Clk. The clock signal Clk is a rectangular-wave signal having a constant period.

The sawtooth wave generator 9 generates the sawtooth-wave signal Saw synchronized with the clock signal Clk.

The voltage detector 90 is connected to the sawtooth wave generator 92 at a non-inverting terminal and to the reference voltage source 10 at an inverting terminal. Accordingly, to the voltage detector 90, the sawtooth-wave signal Saw is input at the non-inverting terminal and the bottom potential Vbtm from the reference voltage source 10 is input at the inverting terminal.

The voltage detector 90 detects that the potential of the sawtooth-wave signal Saw drops below the bottom potential Vbtm to set the synchronous clock signal Clkx to Low, and detects that the potential of the sawtooth-wave signal Saw becomes the bottom potential Vbtm or higher to set the synchronous clock signal Clkx to Hi. Details of the voltage detector 90 will be described later.

The reset control circuit 91 is a flip-flop, for example. The clock signal Clk is input to a clock input terminal CK, and the synchronous clock signal Clkx is input to a negative-logic reset terminal R. At the moment when the clock signal Clk becomes Hi, the reset control circuit 91 takes in a state of its input terminal D and stores the state therein, and at the same time outputs the state as the reset signal Rst from an output terminal Q. A signal that is always Hi is input to the input terminal D. That is, the reset signal Rst output from the output terminal Q becomes Hi at the moment when the clock signal Clk becomes Hi. Meanwhile, when the synchronous clock signal Clkx is Low, the reset control circuit 91 resets its internal state to Low and outputs that state as the reset signal Rst. That is, the reset signal Rst output from the output terminal Q is a signal having a short Hi pulse width which becomes Hi at the moment when the clock signal Clk becomes Hi, and becomes Low at the moment when the synchronous clock signal Clkx becomes Low.

The reset signal Rst is input to the sawtooth wave generator 92. The sawtooth wave generator 92 causes the potential of the sawtooth-wave signal Saw to drop rapidly toward 0 V at the moment when the reset signal Rst transitions to Hi.

Thereafter, when the reset signal Rst transitions to Low, the sawtooth wave generator 92 raises the potential of the sawtooth-wave signal Saw at a constant rate. The sawtooth wave generator 92 outputs the sawtooth-wave signal Saw to the non-inverting input terminal of the voltage detector 90 and the PWM circuit 1. The detailed configuration of the sawtooth wave generator 92 is also described later.

A negative terminal of the reference voltage source 10 is connected to the grounding power supply, and a positive terminal thereof is connected to the inverting input terminal of the voltage detector 90. Although the reference voltage source 10 is represented by an ideal power supply in the present embodiment, it may be a circuit of any form as long as it can generate the bottom potential Vbtm that is constant.

Figure 2:
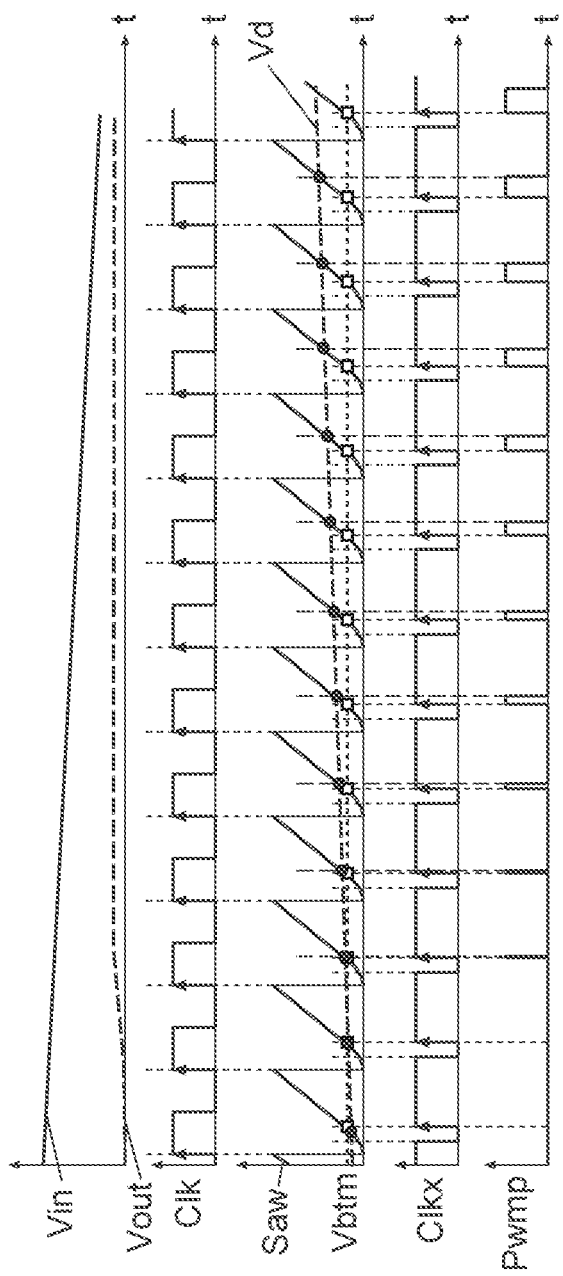
FIG. 2 is a diagram of operation waveforms of the switching power supply according to the first embodiment.

FIG. 2 is a diagram of operation waveforms of the switching power supply 100 according to the first embodiment. FIG. 2 illustrates, from the top along the vertical axis, the input power-supply voltage Vin, the output power-supply voltage Vout, the clock signal Clk, the sawtooth-wave signal Saw, the duty-instruction voltage signal Vd, the bottom potential Vbtm, the synchronous clock signal Clkx, and the PWM signal Pwmp. The horizontal axis represents a time.

That is, the uppermost part illustrates a voltage waveform of the input power-supply voltage Vin of an input power supply with a solid line and a voltage waveform of the output power-supply voltage Vout with a broken line.

The next part illustrates a waveform of the clock signal Clk. The clock signal Clk is a rectangular-wave signal that becomes Hi at a constant period as described above.

Further, the next part illustrates the sawtooth-wave signal Saw with a solid line, the duty-instruction voltage signal Vd with a broken line, and the bottom potential Vbtm of the sawtooth-wave signal Saw with a dotted line. The sawtooth-wave signal Saw is reset to a ground potential 0 V at the moment when the clock signal Clk transitions to Hi, and its potential rises at a constant rate from immediately after the reset. An intersection at which the potential of the sawtooth-wave signal Saw exceeds the bottom potential Vbtm is denoted with a square, and an intersection at which the potential of the sawtooth-wave signal Saw exceeds the potential of the duty-instruction voltage signal Vd is denoted with a black circle.

The next part illustrates the synchronous clock signal Clkx. The synchronous clock signal Clkx is a rectangular-wave signal that is Hi when the potential of the sawtooth-wave signal Saw is higher than the bottom potential Vbtm, that is, becomes Hi at the timing of the square, and is Low at other times, that is, when the potential of the sawtooth-wave signal Saw is lower than the bottom potential Vbtm.

The lowermost part illustrates the PWM signal Pwmp. The PWM signal Pwmp becomes Hi at a timing of a transition of the synchronous clock signal Clkx to Hi, and is Low when the potential of the sawtooth-wave signal Saw is higher than the potential of the duty-instruction voltage signal Vd (becomes Low at the timing of the black circle).

The input power-supply voltage Vin of the input power supply changes from a very high voltage that is ten times higher than the output power-supply voltage Vout to a voltage that is approximately twice the output power-supply voltage Vout. Meanwhile, the output power-supply voltage Vout is maintained at a constant voltage Vout that is set by a resistance division ratio of the voltage divider 4 and the reference voltage Vref generated by the reference voltage source 5.

At this time, a Hi pulse-width duty D of the PWM signal Pwmp is substantially equal to the ratio of the output power-supply voltage Vout to the input power-supply voltage Vin as represented by Equation (1) because of an action of a feedback control loop.

[Equation (1)]

$$D = \frac{Vout}{Vin} \quad (1)$$

In the waveform diagram of FIG. 2, the Hi pulse-width duty D of the PWM signal Pwmp changes from a value below 10% to a value that is approximately 50%. Here, attention is paid to the left portion of the waveform diagram of FIG. 2, that is, a case where the input power-supply voltage Vin is very high with respect to the output power-supply voltage Vout.

The switching frequency of the switching power supply 100 these days tends to increase from several hundred kHz to several MHz. With this increase, an on-duration of a switching operation is reduced from several tens of nanoseconds to several nanoseconds or shorter. In the switching power supply 100, a value of the output power-supply voltage Vout is changed in accordance with the on-duration of the switching operation in the switching driver 2. Therefore, when the input power-supply voltage Vin is very high with respect to the output power-supply voltage Vout, it is important whether the switching operation having an on-duration of several nanoseconds or shorter in the switching driver 2 can be performed stably.

Linearity immediately after the potential of the sawtooth-wave signal Saw starts to rise is not good because of the influence of a parasitic capacitance or the like. Also for the sawtooth-wave signal Saw in the present embodiment, illustrated in FIG. 2, its waveform is rounded and the rate of potential rise is not constant in a region below the bottom potential Vbtm. However, the switching power supply 100 according to the present embodiment does not use the sawtooth wave in that region. Instead, the switching power supply 100 uses the sawtooth-wave signal Saw after the potential of the sawtooth-wave signal Saw exceeds the bottom potential Vbtm and the linearity thereof becomes sufficiently good. Accordingly, it is possible to stably perform a switching operation having a short on-duration of several nanoseconds or shorter.

A state where the linearity of the sawtooth-wave signal Saw is good means that a rising timing of the sawtooth-wave signal and a timing of a Hi transition of the synchronous clock signal Clkx match with each other and the rate of potential rise of the sawtooth-wave signal Saw after the Hi transition of the synchronous clock signal Clkx is constant. In the present embodiment, the PWM signal Pwmp is generated by using the difference between the timing of the Hi transition of the synchronous clock signal Clkx and a timing at which the potential of the sawtooth-wave signal Saw exceeds the duty-instruction voltage signal Vd. Because of this generation manner, it is possible to hide a range of the sawtooth-wave signal in which the linearity is not good and to stably control generation of the PWM signal Pwmp that has a very narrow pulse.

If the PWM signal Pwmp is generated by using a sawtooth-wave signal that is not good in linearity, the output power-supply voltage Vout becomes unstable. For example, if the synchronous clock signal Clkx transitions to Hi before the potential of the sawtooth-wave signal Saw starts to rise, there arises a problem that a short-duration pulse is eliminated or the potential of the PWM signal Pwmp is fixed to be Hi for one period, for example. Further, if the potential rising rate of the sawtooth-wave signal Saw is not constant, there arises a problem that a switching pulse width varies periodically.

Meanwhile, the voltage accuracy of the bottom potential Vbtm and the accuracy of the potential rising rate of the sawtooth-wave signal Saw are not so important. This is because, even if the bottom potential Vbtm of the sawtooth-wave signal Saw somewhat deviates from an expected value, the potential of the error signal Err of the error amplifier 6 is automatically adjusted because of the action of the feedback control loop, so that fluctuation with respect to the output power-supply voltage Vout is suppressed. Further, even if the rate of potential rise of the sawtooth-wave signal Saw somewhat deviates from an expected value, its influence on the output power-supply voltage Vout is small although a response time to load fluctuation varies in proportion to the deviation.

Figure 3:
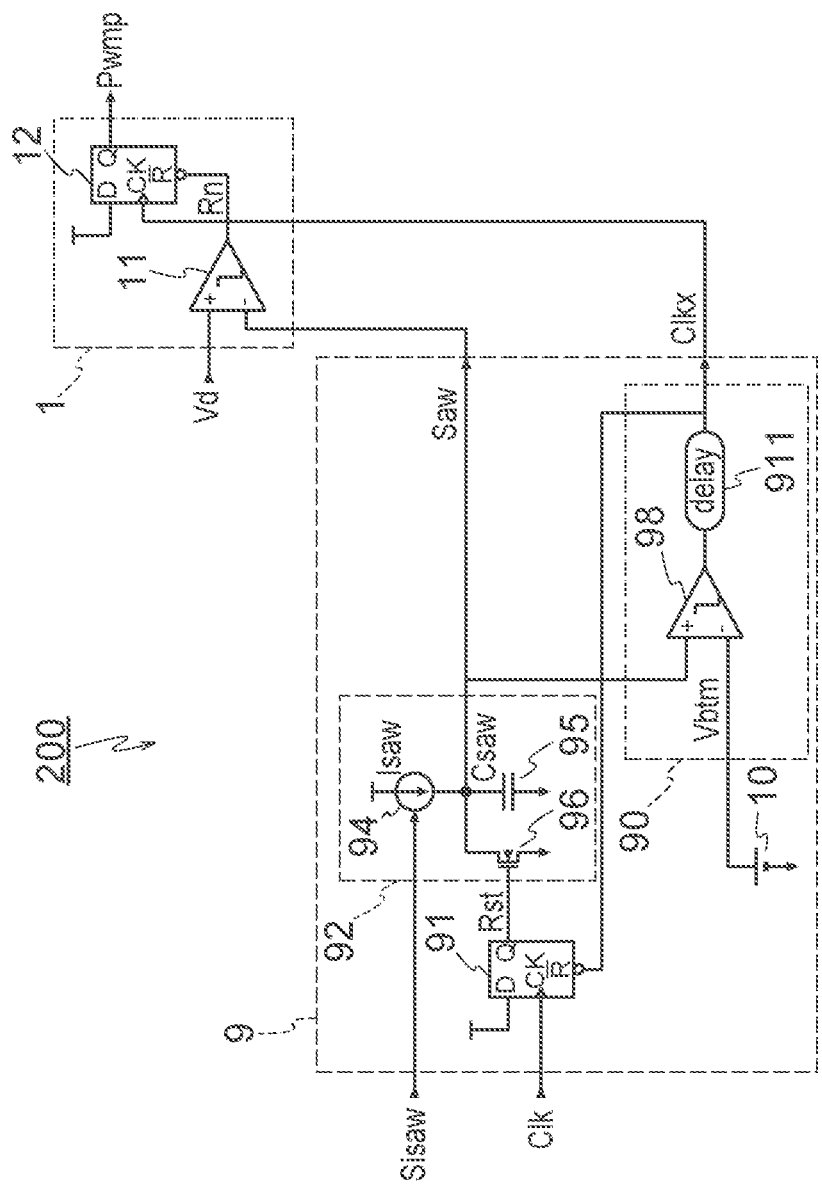
FIG. 3 is a diagram illustrating a detailed configuration example of a sawtooth-wave output circuit and a PWM circuit.

FIG. 3 is a diagram illustrating a detailed configuration example of the sawtooth wave generator 9 and the PWM circuit 1.

The voltage detector 90 of the sawtooth wave generator 9 includes a comparator 98 and a synchronous-clock delay circuit (delay) 911. The sawtooth wave generator 92 includes a constant current source 94, an adjustment capacity 95, and a reset NMOS transistor 96. The PWM circuit 1 includes a comparator 11 and a flip-flop 12. The flip-flop 12 corresponds to a first PWM-signal output circuit, the comparator 98 corresponds to a first detector, and the comparator 11 corresponds to a second detector.

FIG. 3 further illustrates the clock signal Clk, the bottom potential Vbtm, the synchronous clock signal Clkx, the sawtooth-wave signal Saw, a constant current Isaw, a current control signal Sisaw, the duty-instruction voltage signal Vd, the reset signal Rst, and a PWM reset signal Rn. The reference voltage source 10 and the voltage detector 90 may be provided outside the sawtooth wave generator 9.

The constant current source 94 is controlled by the current control signal Sisaw to output the constant current Isaw. The constant current source 94 is connected to one terminal of the adjustment capacity 95, and a grounding power supply is connected to the other terminal thereof.

In the reset NMOS transistor 96, a source terminal and a drain terminal are electrically connected to each other when the reset signal Rst is Hi. Meanwhile, the source terminal and the drain terminal are not electrically connected to each other when the reset signal Rst is Low.

Because the reset signal Rst is Low when the synchronous clock signal Clkx that is an output of the synchronous-clock delay circuit (delay) 911 is Low, the adjustment capacity 95 having a capacitance value Csaw is charged by the charging current Isaw that is caused to flow by the constant current source 94. Accordingly, the potential Vsaw of the sawtooth-wave signal Saw rises at a constant rate of dVsaw/dt as represented by Equation (2).

[Equation (2)]

$$\frac{dV_{saw}}{dt} = \frac{I_{saw}}{C_{saw}} \quad (2)$$

When the reset signal Rst is Hi, the reset NMOS transistor 96 discharges the adjustment capacity 95. Accordingly, the potential of the sawtooth-wave signal Saw rapidly drops toward a grounding power-supply potential of 0 V.

The bottom potential Vbtm is input to an inverting input terminal of the comparator 98, and the sawtooth-wave signal Saw is input to a non-inverting input terminal thereof. The synchronous clock output signal Clkx is output from an output terminal of the comparator 98 via the synchronous-clock delay circuit 911. The comparator 98 sets the synchronous clock signal Clkx to Low when the potential of the sawtooth-wave signal Saw is lower than the bottom potential Vbtm, and sets the synchronous clock signal Clkx to Hi at other times.

In response to a transition of the synchronous clock signal Clkx to Low in the manner described above, the reset control circuit 91 sets the reset signal Rst to Low. That is, when the synchronous clock signal Clkx becomes Low, the adjustment capacity 95 is discharged and its potential drops below the bottom potential Vbtm, so that a potential drop of the sawtooth-wave signal Saw is automatically stopped. However, the potential of the sawtooth-wave signal Saw drops to nearly 0 V that is the ground potential because of delays generated in the comparator 98 and the synchronous-clock delay circuit 911.

The pulse-width instruction voltage signal Vd is input to a non-inverting input terminal of the comparator 11, and the sawtooth-wave signal Saw is input to an inverting input terminal thereof. The comparator 11 sets the PWM reset signal Rn that is its output to Hi when the potential of the sawtooth-wave signal Saw is lower than the pulse-width instruction voltage signal Vd, and sets the PWM reset signal Rn to Low at other times. That is, a timing of a transition to Low of the PWM reset signal Rn corresponds to the second timing.

The synchronous clock signal Clkx is input to a clock input terminal CK of the flip-flop 12, and the PWM reset signal Rn output from the comparator 11 is input to a negative-logic reset terminal R thereof. At the moment when the synchronous clock signal Clkx becomes Hi, the flip-flop 12 takes in a state of its input terminal D and stores the state therein, and at the same time outputs the state to an output terminal Q. A signal that is always Hi is input to the input terminal D. That is, the PWM signal Pwmp output from the output terminal Q becomes Hi at the moment when the synchronous clock signal Clkx becomes Hi.

Meanwhile, when the PWM reset signal Rn is Low, the flip-flop 12 resets its internal state to Low and outputs that state. That is, the PWM signal Pwmp output from the output terminal Q is Low. In this manner, the flip-flop 12 generates the PWM signal Pwmp based on a time difference between the first timing that corresponds to a timing at which the potential of the sawtooth-wave signal Saw exceeds the bottom potential Vbtm detected by the comparator 98, and the second timing that corresponds to a timing at which the potential of the sawtooth-wave signal Saw exceeds the potential of the first pulse-width instruction voltage signal Vd detected by the comparator 11.

Further, when the PWM reset signal Rn is Low, the flip-flop 12 resets its internal state to Low. This reset operation is asynchronous and has priority over the take-in operation described above. That is, when the potential of the pulse-width instruction voltage signal Vd is lower than the bottom potential Vbtm, the flip-flop 12 ignores a transition to Hi of the synchronous clock signal Clkx even if this transition occurs, and maintains the PWM signal Pwmp at Low.

A common switching power supply inputs a clock signal and a reset signal to an asynchronous RS latch and generates the PWM signal Pwmp. At this time, if a timing of the clock signal and a timing of the reset signal slightly deviate from each other, the PWM signal Pwmp is not generated. Instead, there arises a problem that an output is fixed to Hi for one period.

Further, in a common switching power supply, a single comparator compares the potential of the sawtooth-wave signal Saw and the pulse-width instruction voltage signal Vd with each other to generate the PWM signal Pwmp. Therefore, a response speed of the comparator is limited, and the comparator cannot respond to a momentary operation of an input signal occurring in several tens of nanoseconds or shorter. For example, under a condition where the potential of the sawtooth-wave signal Saw falls below the potential of the pulse-width instruction voltage signal Vd momentarily, a PWM comparator cannot respond, so that the PWM reset signal Rn is fixed to Low.

As described above, in the common switching power supply, the minimum pulse width of the PWM signal Pwmp is limited to several tens of nanoseconds by the response speed of the comparator. Even if the PWM signal Pwmp having a narrower pulse width is to be generated, the PWM signal Pwmp is fixed to Low. In this case, it is difficult to output a power having a stable voltage.

Meanwhile, the switching power supply 100 according to the present embodiment uses two comparators, that is, the comparator 11 and the comparator 98. The comparator 11 detects a timing at which the potential of the sawtooth-wave signal Saw exceeds the potential of the pulse-width instruction voltage signal Vd and outputs the PWM reset signal Rn.

Meanwhile, the comparator 98 detects a timing at which the potential of the sawtooth-wave signal Saw exceeds the bottom potential Vbtm and outputs the synchronous clock signal Clkx. Here, a feature of the switching power supply 100 according to the present embodiment is that a transition of the state of the PWM reset signal Rn and a transition of the state of the synchronous clock signal Clkx both occur every switching cycle.

Further, the switching power supply 100 according to present embodiment uses circuits having the same characteristics for the comparators 11 and 98. More specifically, circuits that are equivalent to each other in a signal response time are used for the comparators 11 and 98. Accordingly, a delay generated in detection of the timing at which the potential of the sawtooth-wave signal Saw exceeds the bottom potential Vbtm, generated by the comparator 98, and a delay generated in detection of the timing at which the potential of the sawtooth-wave signal Saw exceeds the potential of the pulse-width instruction voltage signal Vd, generated by the comparator 11, are equal to each other. Therefore, it is possible to cancel out the two detection delays by obtaining a time difference between the two timings. In particular, when the potential of the pulse-width instruction voltage signal Vd and the bottom potential Vbtm are substantially equal to each other, the difference between a timing of the PWM reset signal Rn and a timing of the synchronous clock signal Clkx is very small, but it is possible to generate even the PWM signal Pwmp having such a narrow pulse width (even if the pulse width is 0.1 nanosecond or less).

As described above, the limit of the pulse width of the PWM signal Pwmp is limited by the response speed of the flip-flop 12. A signal response time of the flip-flop 12 is less than 1 nanosecond and is tens of times faster than that of a comparator. Therefore, the limit of the pulse width of the PWM signal Pwmp is reduced to several percent as compared with that in a common switching power supply limited by a signal response time of a comparator.

As described above, the switching power supply 100 according to the present embodiment is configured in such a manner that the comparator 98 detects the first timing that corresponds to a timing at which the potential of the sawtooth-wave signal Saw exceeds the bottom potential Vbtm, the comparator 11 detect the second timing that corresponds to a timing at which the potential of the sawtooth-wave signal Saw exceeds the potential of the pulse-width instruction voltage signal Vd, and the flip-flop 12 generates the PWM signal Pwmp based on the difference between these timings. Accordingly, a range of the sawtooth-wave signal Saw in which linearity is stable can be used, and the width of a Hi pulse of the PWM signal Pwmp based on the difference between these timings can be stably reduced to a range of the order of a response speed in the flip-flop 12. Because of stable generation of the PWM signal Pwmp having a short pulse width in this manner, it is possible to provide a buck switching power supply having a high step-down ratio in which the output power-supply voltage Vout is one tenth or less of the input power-supply voltage Vin.

Further, when the potential of the pulse-width instruction voltage signal Vd is lower than the bottom potential Vbtm, the flip-flop 12 ignores a transition to Hi of the synchronous clock signal Clkx even if this transition occurs, and maintains the PWM signal Pwmp at Low. Accordingly, the duty of the PWM signal Pwmp becomes 0, and it is possible to maintain the output power-supply voltage Vout at 0 V.

Second Embodiment

The switching power supply 100 according to a second embodiment is a buck switching power supply capable of stably outputting the output power-supply voltage Vout that is a high voltage substantially equal to the input power-supply voltage Vin.

The main configuration is described below. The sawtooth wave generator 9 generates a first sawtooth-wave signal and a second sawtooth-wave signal the phases of which are different from each other by 180 degrees and the period of which is twice the period of the clock signal Clk. The comparator 11 detects a timing at which the potential of one of the sawtooth-wave signals exceeds the potential Vd of a pulse-width instruction voltage signal, and the comparator 98 detects, as a timing of switching the two sawtooth-wave signals, a timing at which the potential of the other sawtooth-wave signal exceeds the bottom potential Vbtm. With this configuration, the present embodiment aims to stably reduce a Low-pulse width when the maximum pulse width of the PWM signal Pwmp is generated (the difference between the timing at which one sawtooth-wave signal exceeds the potential Vd and the timing of switching the two sawtooth-wave signals) to the order of a response speed in the flip-flop 12. In the following descriptions, differences between the switching power supply 100 according to the second embodiment and the switching power supply 100 according to the first embodiment are explained.

Figure 4:
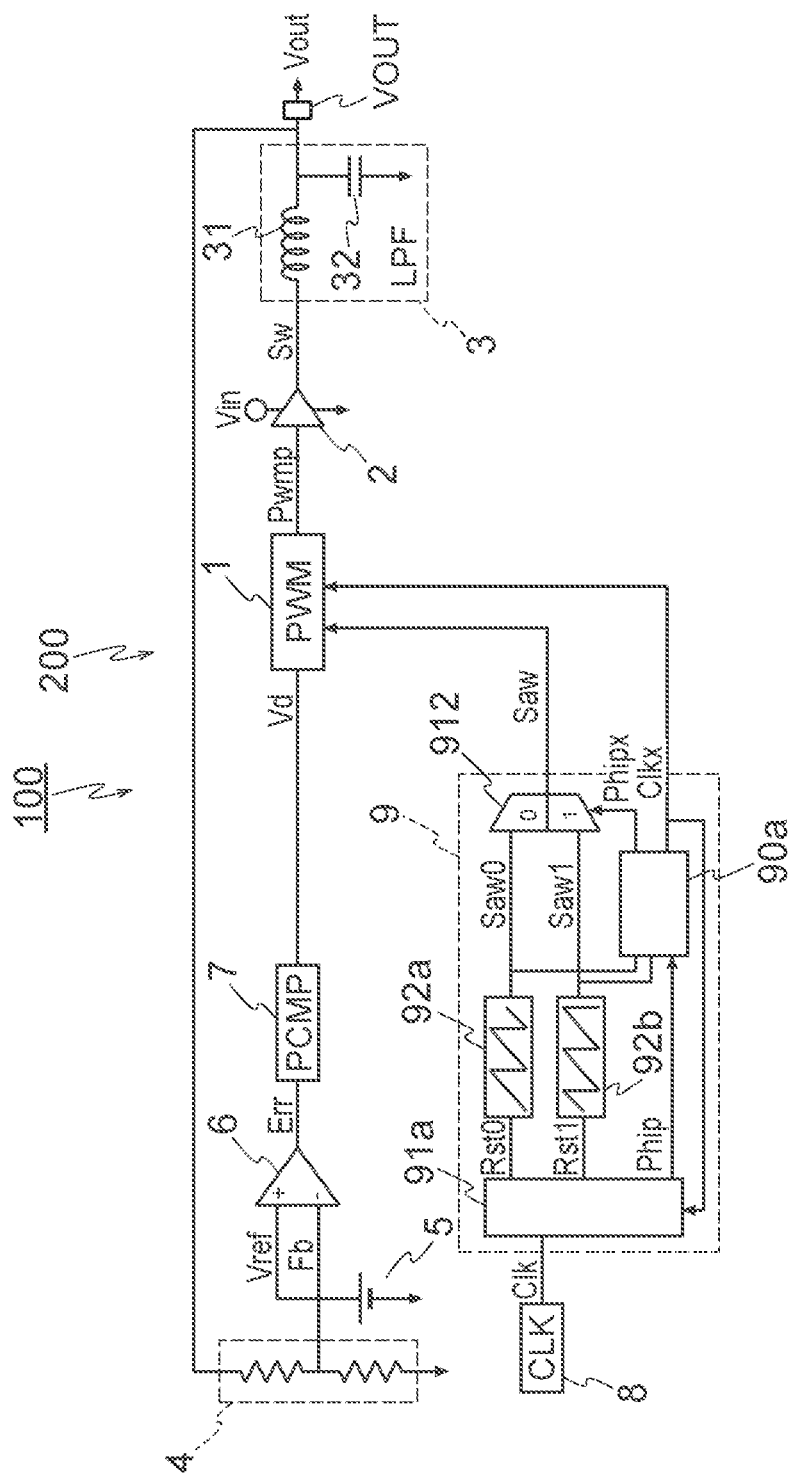
FIG. 4 is a diagram illustrating a configuration example of a switching power supply according to a second embodiment.

FIG. 4 is a diagram illustrating a configuration example of the switching power supply 100 according to the second embodiment. The switching power supply 100 according to the second embodiment includes the PWM circuit 1, the switching driver 2, the LC low-pass filter 3, the voltage divider 4, the reference voltage source 5, the error amplifier 6, the PCMP circuit 7, the CLK 8, and the sawtooth wave generator 9.

The sawtooth wave generator 9 includes a voltage detector 90a, a reset control circuit 91a, a first sawtooth wave generator 92a, a second sawtooth wave generator 92b, and a selector 912. FIG. 4 further illustrates the clock signal Clk, the synchronous clock signal Clkx, a first sawtooth-wave signal Saw0, a second sawtooth-wave signal Saw1, a first reset signal Rst0, a second reset signal Rst1, the sawtooth-wave signal Saw, the duty-instruction voltage signal Vd, a phase signal Phip, a selection signal Phipx, the first reset signal Rst0, the second reset signal Rst1, the switching signal Sw, the PWM signal Pwmp, the reference voltage Vref, and the error signal Err. The first sawtooth wave generator 92a corresponds to a first sawtooth-wave output circuit and the second sawtooth wave generator 92b corresponds to a second sawtooth-wave output circuit.

The voltage detector 90a outputs the synchronous clock signal Clkx. The synchronous clock signal Clkx transitions to Hi at the moment when the potential of the first sawtooth-wave signal Saw0 or the second sawtooth-wave signal Saw1, selected by the phase signal Phip obtained by dividing the clock signal Clk, exceeds the bottom potential Vbtm, and transitions to Low at the moment when the clock signal Clk transitions to Hi. The voltage detector 90a outputs the selection signal Phipx. The selection signal Phipx is a rectangular-wave signal with a period that is twice the period of the clock signal Clk, which alternately transitions to a Hi state and a Low state at timings of Hi transitions of the synchronous clock signal Clkx.

The reset control circuit 91a is connected to the CLK 8 and generates the phase signal Phip obtained by dividing the clock signal Clk, the first reset signal Rst0, and the second reset signal Rst1 having a phase delayed by 180° with respect to the first reset signal Rst0. The first sawtooth wave generator 92a generates the first sawtooth-wave signal Saw0 with a period that is twice the period of the clock signal Clk based on the first reset signal Rst0. The second sawtooth wave generator 92b generates the second sawtooth-wave signal Saw1 having a phase delayed by 180° with respect to the first sawtooth-wave signal Saw0 based on the second reset signal Rst1.

The selector 912 selects the first sawtooth-wave signal Saw0 when the selection signal Phipx is Low, selects the second sawtooth-wave signal Saw1 when the selection signal Phipx is Hi, and outputs the selected signal as the sawtooth-wave signal Saw. That is, the selector 912 switches and selects a linear range of the first sawtooth-wave signal Saw0 and that of the second-wave signal Saw1 at the first timing at which the potential of the sawtooth-wave signal Saw exceeds the bottom potential Vbtm, and outputs the sawtooth-wave signal Saw having the same period as the clock signal Clk. The selector 912 corresponds to a second selector.

Figure 5:
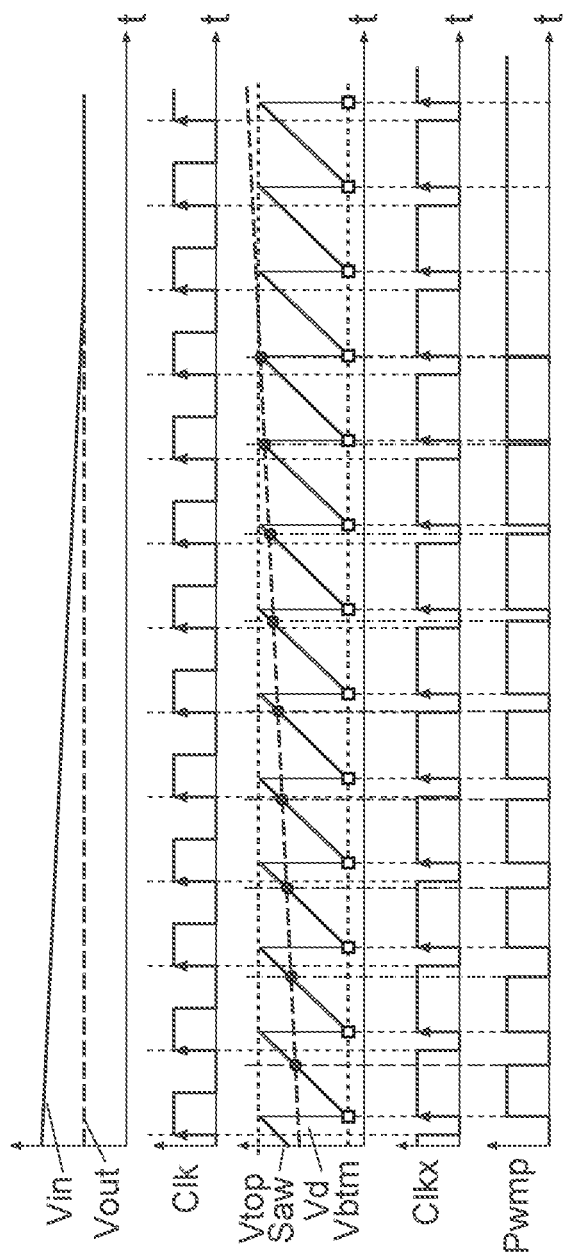
FIG. 5 is a diagram of operation waveforms of the switching power supply according to the second embodiment.

FIG. 5 is a diagram of operation waveforms of the switching power supply 100 according to the second embodiment. FIG. 5 illustrates, from the top along the vertical axis, the input power-supply voltage Vin, the output power-supply voltage Vout, the clock signal Clk, a top potential Vtop, the sawtooth-wave signal Saw, the duty-instruction voltage Vd, the bottom potential Vbtm, the synchronous clock signal Clkx, and the PWM signal Pwmp. The horizontal axis represents a time.

That is, the uppermost part illustrates a voltage waveform of the input power-supply voltage Vin with a solid line and a voltage waveform of the output power-supply voltage Vout with a broken line. The next part illustrates a waveform of the clock signal Clk.

Further, the next part illustrates the top potential Vtop with a dotted line, the sawtooth-wave signal Saw with a solid line, the duty-instruction voltage signal Vd with a broken line, and the bottom potential Vbtm of the sawtooth-wave signal Saw with another dotted line. The next part illustrates the synchronous clock signal Clkx with a solid line. The lowermost part illustrates the PWM signal Pwmp.

The input power-supply voltage Vin of an input power supply changes from a voltage that is twice the output power-supply voltage Vout to a voltage that is substantially the same as the output power-supply voltage Vout. Meanwhile, the output power-supply voltage Vout is maintained at a constant voltage Vout that is set by a resistance division ratio of the voltage divider 4 and the reference voltage Vref of the reference voltage source 5.

Here, a Hi pulse-width duty D of the PWM signal Pwmp is substantially equal to the ratio of the output power-supply voltage Vout to the input power-supply voltage Vin of the input power supply as represented by Equation (1) because of an action of a feedback control loop. Therefore, the Hi pulse-width duty D of the PWM signal Pwmp changes from 50% to approximately 100%, for example.

The potential of the sawtooth-wave signal Saw is instantly reset from the top potential Vtop to the bottom potential Vbtm at a timing of a Hi transition of the synchronous clock signal Clkx, and rises from immediately after the reset at a constant rate. In order to output the stable output power-supply voltage Vout when the input power-supply voltage Vin drops to a substantially equal voltage to the output power-supply voltage Vout, it is necessary that the timing at which the sawtooth-wave signal Saw is reset and the timing of the Hi transition of the synchronous clock signal Clkx match with each other. Further, the rate of potential rise of the sawtooth-wave signal near the top potential Vtop needs to be constant.

The duty of the PWM signal Pwmp becomes larger towards the right portion of the waveform diagram of FIG. 5, that is, as the input power-supply voltage Vin of the input power supply is reduced. In a state where the input power-supply voltage Vin and the output power-supply voltage Vout are substantially equal to each other, an off-duration of a switching operation is reduced from several tens of nanoseconds to several nanoseconds or less, and the duty becomes 100% finally. If the reset timing of the sawtooth-wave signal and the Hi transition timing of the synchronous clock signal Clkx are out of synchronization with each other, a pulse is eliminated (a phenomenon that the duty becomes 0%) or a pulse width becomes unstable. For example, a phenomenon that the pulse width irregularly fluctuates occurs. In any of these cases, the output power-supply voltage Vout becomes unstable and it leads to a serious problem.

Meanwhile, the influence of the voltage accuracy of the top potential Vtop of the sawtooth-wave signal Saw and the influence of the accuracy of an average value of a potential rising rate of the sawtooth-wave signal Saw on stability of the output power-supply voltage Vout are small. This is because, even if the top potential Vtop somewhat deviates from an expected value, the potential of the error signal Err of the error amplifier 6 is automatically adjusted by an action of a feedback control loop, so that fluctuation with respect to the output power-supply voltage Vout is suppressed. Furthermore, even if the average value of the rising rate of the potential Vsaw of the sawtooth-wave signal Saw somewhat deviates from an expected value, the influence of the deviation is such a level that a response time to load fluctuation varies, and the influence on the output power-supply voltage Vout is small.

Figure 6:
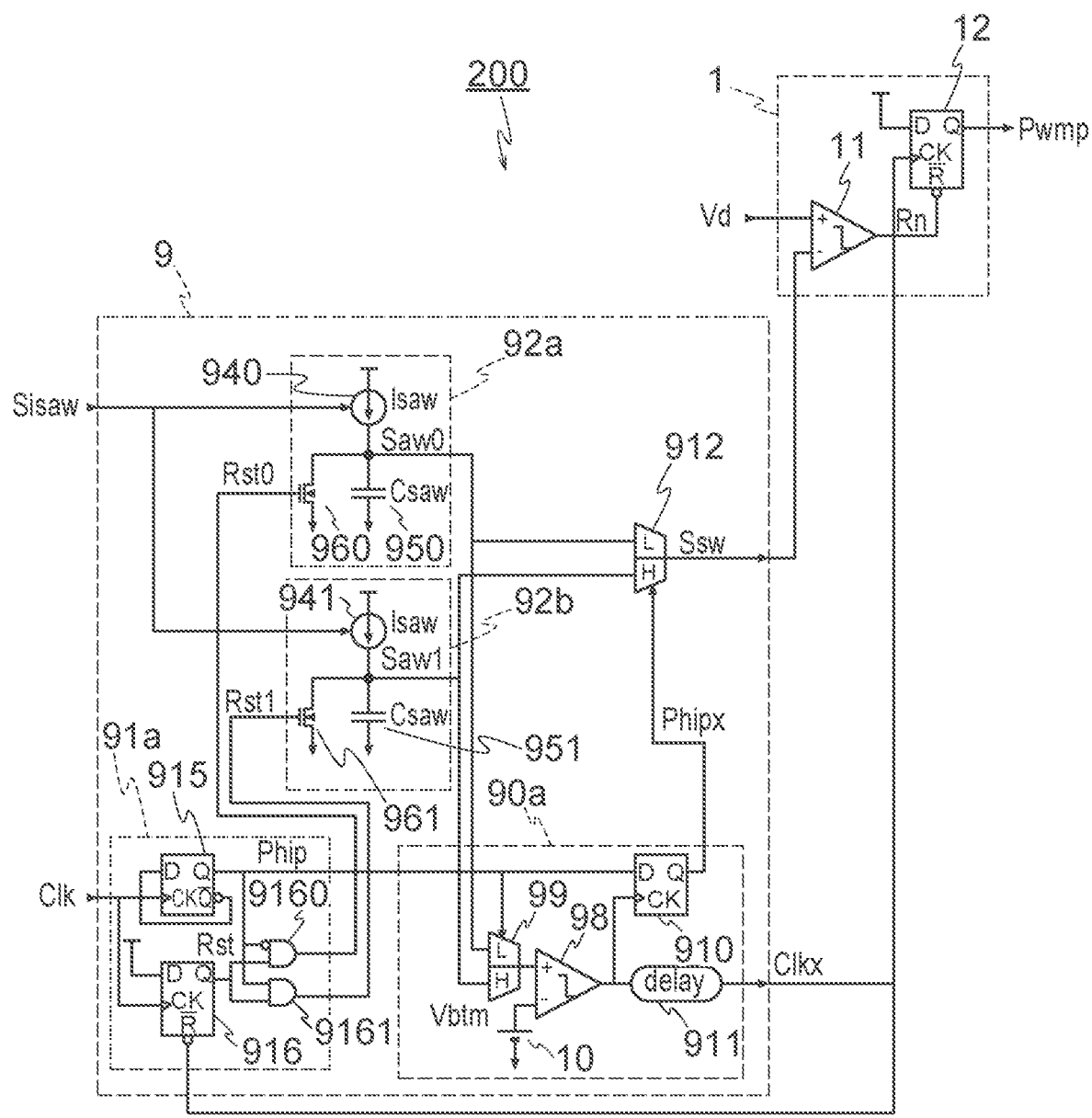
FIG. 6 is a diagram illustrating a detailed configuration example of a sawtooth-wave output circuit and a PWM circuit according to the second embodiment.

FIG. 6 is a diagram illustrating a detailed configuration example of the sawtooth wave generator 9 and the PWM circuit 1 according to the second embodiment. The sawtooth wave generator 9 includes the voltage detector 90a, the reset control circuit 91a, the first sawtooth wave generator 92a, the second sawtooth wave generator 92b, and the selector 912. The voltage detector 90a may be provided outside the sawtooth wave generator 9.

The voltage detector 90a includes the comparator 98, a bottom-potential detecting selector 99, a selection-signal flip-flop 910, and the synchronous-clock delay circuit 911. The reset control circuit 91a includes an input-signal divider 915, a reset signal generator 916, a first reset signal generator 9160, and a second reset signal generator 9161.

The first sawtooth wave generator 92a includes a first constant current source 940, a first adjustment capacity 950, and a first sawtooth-wave signal reset NMOS transistor 960. The second sawtooth wave generator 92b includes a second constant current source 941, a second adjustment capacity 951, and a second sawtooth-wave signal reset NMOS transistor 961. FIG. 6 further illustrates the constant current Isaw, the current control signal Sisaw, the first reset signal Rst0, the second reset signal Rst1, the first sawtooth-wave signal Saw0, the second sawtooth-wave signal Saw1, the sawtooth-wave signal Saw, the duty-instruction voltage signal Vd, the PWM reset signal Rn, the phase signal Phip, the selection signal Phipx, the reset signal Rst, the clock signal Clk, the bottom potential Vbtm, the synchronous clock signal Clkx, and the PWM signal Pwmp.

First, details of the reset control circuit 91a are described. The input-signal divider 915 is a flip-flop, for example, in which the clock signal Clk is input to a clock input terminal CK and an inverted signal of the phase signal Phip output from the input-signal divider 915 itself is input to an input terminal D. At the moment when the clock signal Clk becomes Hi, the input-signal divider 915 takes in an inverted state of the phase signal Phip output by the input-signal divider 915 itself and stores the state therein, and also changes the phase signal Phip to that state. Accordingly, the phase signal Phip becomes a rectangular wave obtained by dividing the clock signal Clk by two.

The reset signal generator 916 is a flip-flop, for example, in which the clock signal Clk is input to a clock input terminal CK, the synchronous clock signal Clkx output by the synchronous-clock delay circuit 911 is input to a negative-logic reset terminal R, and a signal that is always Hi is input to an input terminal D. At the moment when the clock signal Clk becomes Hi, the reset signal generator 916 sets its internal state to Hi, and sets the reset signal Rst to Hi and outputs the reset signal Rst. Further, when the synchronous clock signal Clkx is Low, the reset signal generator 916 resets its internal state to Low, sets the reset signal Rst to Low and outputs the reset signal Rst.

The first reset signal generator 9160 outputs the state of the reset signal Rst as the first reset signal Rst0 when the phase signal Phip is Low. Similarly, the second reset signal generator 9161 outputs the state of the reset signal Rst as the second reset signal Rst1 when the phase signal Phip is Hi. That is, when the phase signal Phip is Low, the first reset signal Rst0 changes from Low to Hi and changes again to Low in accordance with the state of the reset signal Rst. When the phase signal Phip is Hi, the second reset signal Rst1 changes from Low to Hi and changes again to Low in accordance with the state of the reset signal Rst.

Next, details of the voltage detector 90a are described. The voltage detector 90a detects the first timing at which the potential of the first sawtooth-wave signal Saw0 or the second sawtooth-wave signal Saw1, selected by the phase signal Phip, exceeds the bottom potential Vbtm, and outputs the synchronous clock signal Clkx and the selection signal Phipx.

In the bottom-potential detecting selector 99, the first sawtooth-wave signal Saw0 is input to one input terminal, and the second sawtooth-wave signal Saw1 is input to the other input terminal. The selector 99 selects the first sawtooth-wave signal Saw0 when the phase signal Phip is Low, selects the second sawtooth-wave signal Saw1 when the phase signal Phip is Hi, and outputs the selected signal to the non-inverting input terminal of the comparator 98. Here, the phase signal Phip is a signal obtained by dividing the clock signal Clk by two and a transition of its state occurs at a timing of a Hi transition of the clock signal Clk. That is, the bottom-potential detecting selector 99 alternately selects the first sawtooth-wave signal Saw0 and the second sawtooth-wave signal Saw1 and outputs the selected one.

The comparator 98 outputs Hi when the potential of the first sawtooth-wave signal Saw0 or the second sawtooth-wave signal Saw1 input to the non-inverting input terminal is higher than the bottom potential Vbtm input to the inverting input terminal, and outputs Low at other times. That is, an output signal of the comparator 98 is a timing signal that transitions to Hi when the potential of the first sawtooth-wave signal Saw0 or the second sawtooth-wave signal Saw1 exceeds the bottom potential Vbtm. This timing signal is input to a clock input terminal CK of the selection-signal flip-flop 910 and the synchronous-clock delay circuit 911.

The synchronous-clock delay circuit 911 compensates a delay generated in the selection-signal flip-flop 910 and the selector 912 described later, and outputs the synchronous clock signal Clkx. The synchronous clock signal Clkx is input to the clock terminal CK of the flip-flop 12 and serves as a trigger of an operation of the flip-flop 12. In other words, the synchronous-clock delay circuit 911 adjusts a time interval between the first timing that is a timing at which the high-linearity sawtooth-wave signal Saw exceeds the bottom potential Vbtm and the second timing that is a timing at which the sawtooth-wave signal Saw exceeds the potential of the pulse-width instruction voltage signal Vd, and cancels out the difference of response speed between circuit paths.

In the selection-signal flip-flop 910, the timing signal output from the comparator 98 is input to the clock input terminal CK. At the moment when this timing signal transitions to Hi, the selection-signal flip-flop 910 takes in a state of the phase signal Phip input to a data input terminal D, and outputs that state from a data output terminal Q as the selection signal Phipx.

Accordingly, as described later, the selection signal Phipx becomes a rectangular-wave signal obtained by dividing the clock signal Clk by two, the state of which transitions at the timing at which the potential of the first sawtooth-wave signal Saw0 or the second sawtooth-wave signal Saw1 exceeds the bottom potential Vbtm.

Next, details of the first sawtooth wave generator 92a and the second sawtooth wave generator 92b are described. The first sawtooth wave generator 92a and the second sawtooth wave generator 92b receive the first reset signal Rst0 and the second reset signal Rst1 and output the first sawtooth-wave signal Saw0 and the second sawtooth-wave signal Saw1 that are obtained by dividing the clock signal Clk by two and are different from each other in the phase by 180°, respectively.

The first constant current source 940 is controlled by the current control signal Sisaw to output the constant charging current Isaw. The first constant current source 940 is connected to one terminal of the first adjustment capacity 950, and a grounding power supply is connected to the other terminal thereof.

In the first sawtooth-wave signal reset NMOS transistor 960, the first reset signal Rst0 is input to a gate. In the first sawtooth-wave signal reset NMOS transistor 960, a source terminal and a drain terminal are electrically connected to each other when the first reset signal Rst0 is Hi. On the other hand, the source terminal and the drain terminal are not electrically connected to each other when the first reset signal Rst0 is Low.

When the first reset signal Rst0 is Hi, the first adjustment capacity 950 is discharged, and the potential of the sawtooth-wave signal Saw is caused to rapidly drop toward the a grounding power-supply potential of 0 V and is reset to the grounding power-supply potential of 0 V. On the other hand, when the first reset signal Rst0 is Low, the first adjustment capacity 950 is charged by the charging current Isaw that is caused to flow by the first constant current source 940. The potential of the first adjustment capacity 950 is output to the selector 912 as the first sawtooth-wave signal Saw0. The rate of potential rise of the first sawtooth-wave signal Saw0 can be set by values of the capacitance Csaw of the first adjustment capacity 950 and the charging current Isaw.

The second sawtooth wave generator 92b also has an identical configuration to the first sawtooth wave generator 92a.

The second constant current source 941 is controlled by the current control signal Sisaw to output the constant charging current Isaw. The second constant current source 941 is connected to one terminal of the second adjustment capacity 951, and the grounding power supply is connected to the other terminal thereof.

In the second sawtooth-wave signal reset NMOS transistor 961, the second reset signal Rst1 is input to a gate. In the second sawtooth-wave signal reset NMOS transistor 961, a source terminal and a drain terminal are electrically connected to each other when the second reset signal Rst1 is Hi. On the other hand, the source terminal and the drain terminal are not electrically connected to each other when the second reset signal Rst1 is Low.

When the second reset signal Rst1 is Hi, the second adjustment capacity 951 is discharged, and the potential of the sawtooth-wave signal Saw is caused to rapidly drop toward the the grounding power-supply potential of 0 V and is reset to the grounding power-supply potential of 0 V. On the other hand, when the second reset signal Rst1 is Low, the second adjustment capacity 951 is charged by the charging current Isaw that is caused to flow by the second constant current source 941. The potential of the second adjustment capacity 951 is output to the selector 912 as the second sawtooth-wave signal Saw1. The rate of potential rise of the second sawtooth-wave signal Saw1 can be set by values of the capacitance Csaw of the second adjustment capacity 951 and the charging current Isaw. Further, when the first and second reset signals Rst0 and Rst1 become Low, the first and second sawtooth-wave signal reset NMOS transistors 960 and 961 end a reset operation, respectively. Because of a delay generated in the comparator 98 after the reset operation is ended, the potential of the first or second sawtooth-wave signal Saw0 or Saw1 that is reset reaches substantially the ground potential 0 V.

The selector 912 selects the first sawtooth-wave signal Saw0 when the selection signal Phipx is Low, selects the second sawtooth-wave signal Saw1 when the selection signal Phipx is Hi, and outputs the selected signal as the sawtooth-wave signal Saw.

That is, the selector 912 alternately changes a selected sawtooth-wave signal at the timing at which the potential of the first sawtooth-wave signal Saw0 or the second sawtooth-wave signal Saw1 exceeds the bottom potential Vbtm detected by the comparator 98, and outputs the selected sawtooth-wave signal.

Accordingly, the sawtooth-wave signal Saw output from the selector 912 is a high-linearity signal having a constant potential rising rate.

Next, details of the PWM circuit 1 are described. The sawtooth-wave signal Saw, the synchronous clock signal Clkx, and the pulse-width instruction voltage signal Vd are input to the PWM circuit 1. The PWM circuit 1 outputs the PWM signal Pwmp in response to the pulse-width instruction voltage signal Vd.

In the comparator 11, the pulse-width instruction voltage signal Vd is input to a non-inverting input terminal, and the sawtooth-wave signal Saw is input to an inverting input terminal thereof. The comparator 11 outputs the PWM reset signal Rn to the flip-flop 12, which becomes Hi when the potential of the sawtooth-wave signal Saw is lower than the potential of the pulse-width instruction voltage signal Vd, and becomes Low at other times. That is, the comparator 11 detects the second timing at which the potential of the sawtooth-wave signal Saw exceeds the potential of the pulse-width instruction voltage signal Vd, and generates the PWM reset signal Rn. Further, the comparator 11 maintains the PWM reset signal Rn at Hi when the potential of the pulse-width instruction voltage signal Vd is higher than the top potential Vtop.

In the flip-flop 12, the synchronous clock signal Clkx is input to a clock input terminal CK, the PWM reset signal Rn output from the comparator 11 is input to a negative-logic reset terminal R, and a signal that is always Hi is input to a data terminal D. At the moment when the synchronous clock signal Clkx transitions to Hi, the flip-flop 12 sets its internal state to Hi and outputs that state from the data output terminal Q as the PWM signal Pwmp.

Further, when the PWM reset signal Rn is Low, the flip-flop 12 resets its internal state to Low and outputs that state as the PWM signal. Accordingly, a Hi pulse width of the PWM signal Pwmp changes in accordance with the potential of the pulse-width instruction voltage signal Vd. When the potential of the pulse-width instruction voltage signal Vd is higher than the top potential Vtop, the state of the PWM reset signal Rn is maintained at Hi and does not become Low. Therefore, the duty of the PWM signal Pwmp becomes 100%.

In the present embodiment, the sawtooth-wave signal Saw is generated by a switching operation by the selector 912. The selector 912 can be configured by a transfer switch by a simple MOS transistor. The operation of the selector 912 is faster as compared with an operation of discharging and resetting the first and second adjustment capacities 950 and 951 by the first and second sawtooth-wave signal reset NMOS transistors 960 and 961.

The linearity of the sawtooth-wave signal Saw generated by the switching operation by the selector 912 is high especially around Vtop. Therefore, when the potential of the pulse-width instruction voltage signal Vd is substantially the same as the top potential Vtop, the comparator 11 can output the PWM reset signal Rn having a very short Low pulse width (for example, a Low pulse width of 1 nanosecond or less).

Further, because the timing of the Hi transition of the synchronous clock signal Clkx is generated by the comparator 98 that has the same electric characteristics as the comparator 11 as described above, delays generated in both the comparators are canceled out, so that timing deviation is suppressed.

Furthermore, it is possible to adjust a timing margin by the synchronous-clock delay circuit 911.

Figure 7:
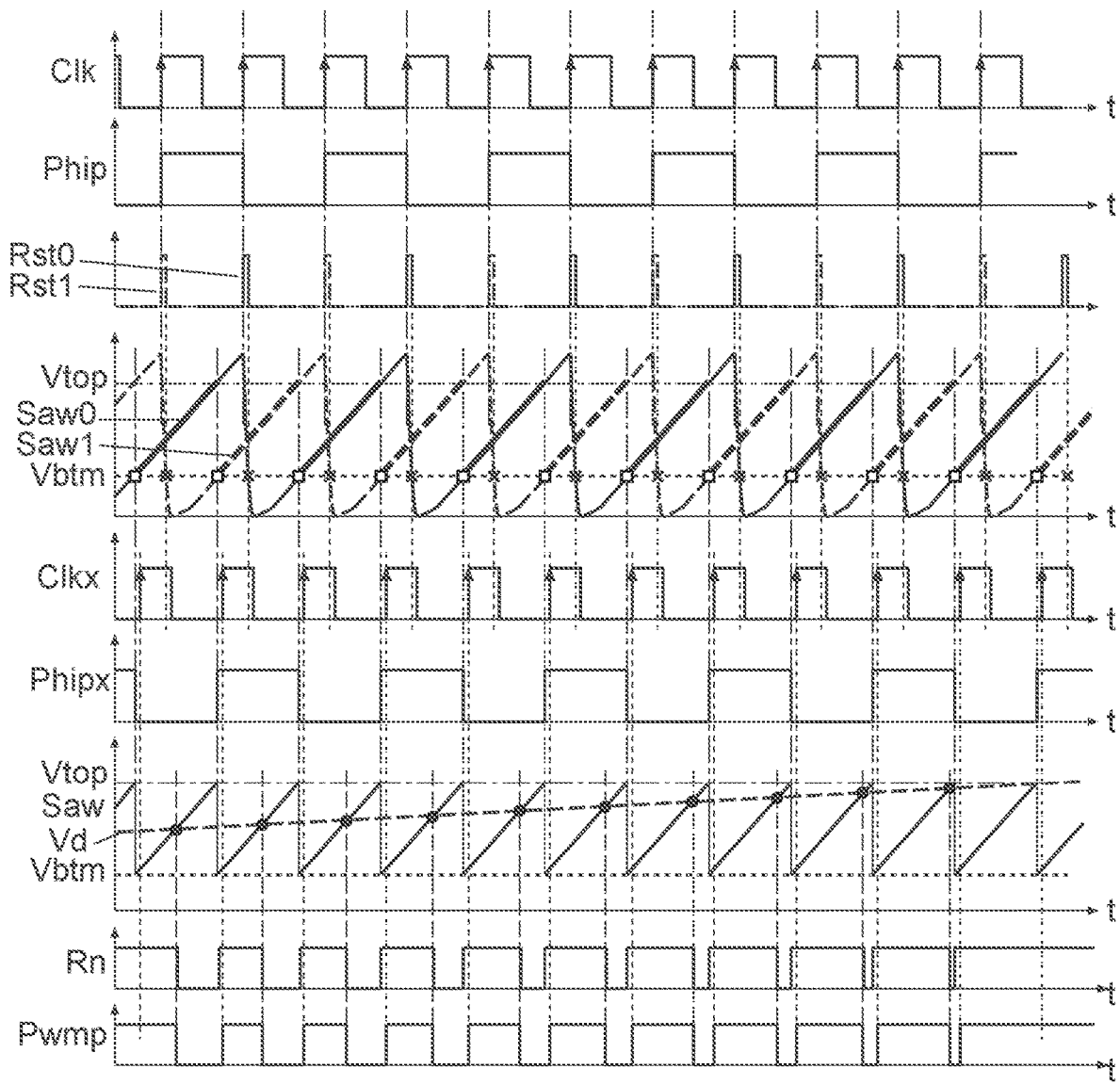
FIG. 7 is a diagram of operation waveforms of the switching power supply according to the second embodiment.

FIG. 7 is a diagram of operation waveforms of the switching power supply 100 according to the second embodiment. FIG. 7 illustrates, from the top along the vertical axis, the clock signal Clk, the phase signal Phip, the first reset signal Rst0, the second reset signal Rst1, the top potential Vtop, the first sawtooth-wave signal Saw0, the second sawtooth-wave signal Saw1, the bottom potential Vbtm, the selection signal Phipx, the synchronous clock signal Clkx, the top potential Vtop, the sawtooth-wave signal Saw, the duty-instruction voltage signal Vd, the bottom potential Vbtm, the PWM reset signal Rn, and the PWM signal Pwmp. The horizontal axis represents a time.

That is, the uppermost part illustrates the clock signal Clk. The clock signal Clk is a rectangular-wave signal having a constant period. In synchronization with a Hi transition timing of the clock signal Clk, the following signals operate.

The next part illustrates the phase signal Phip. The phase signal Phip is a divided signal the state of which transitions at the moment when the clock signal Clk becomes Hi.

The next part illustrates the first reset signal Rst0 with a solid line and the second reset signal Rst1 with a broken line. The first reset signal Rst0 and the second reset signal Rst1 are pulse signals that alternately transition to Hi at the Hi transition timings of the clock signal Clk.

The next part illustrates the first sawtooth-wave signal Saw0 with a solid line, the second sawtooth-wave signal Saw1 with a broken line, the bottom potential Vbtm with a dotted line, an intersection at which the potential of the first sawtooth-wave signal Saw0 or the second sawtooth-wave signal Saw1 becomes lower than the bottom potential Vbtm with a cross, and an intersection at which the potential of the first sawtooth-wave signal Saw0 or the second sawtooth-wave signal Saw1 exceeds the bottom potential Vbtm with a square.

The first sawtooth-wave signal Saw0 is reset to a grounding power-supply potential when the first reset signal Rst0 is Hi. Similarly, the second sawtooth-wave signal Saw1 is reset to the grounding power-supply potential when the second reset signal Rst1 is Hi. The first and second reset signals Rst0 and Rst1 each become Low when it is detected that the potential of the corresponding one of the first and second sawtooth-wave signals Saw0 and Saw1 becomes the bottom potential Vbtm or lower. At this time, the potential of the sawtooth-wave signal becomes substantially the grounding power-supply potential of 0 V because of delays in the comparator 98 and the synchronous-clock delay circuit 911. For a time period during which the first and second reset signals Rst0 and Rst1 are Low, the potentials of the first and second sawtooth-wave signals Saw0 and Saw1 rise at a constant rate.

The next part illustrates the synchronous clock signal Clkx. While the phase signal Phip is Low, the synchronous clock signal Clkx becomes Hi when the potential of the first sawtooth-wave signal Saw0 exceeds the bottom potential Vbtm (at the timing of the square), and becomes Low when the potential of the first sawtooth-wave signal Saw0 exceeds the top potential Vtop (at the timing of the cross). Similarly, while the phase signal Phip is High, the synchronous clock signal Clkx becomes Hi when the potential of the second sawtooth-wave signal Saw1 exceeds the bottom potential Vbtm (at the timing of the square), and becomes Low when the potential of the second sawtooth-wave signal Saw1 exceeds the top potential Vtop (at the timing of the cross).

The next part illustrates the selection signal Phipx. The selection signal Phipx is generated by taking a state of the phase signal Phip into the selection-signal flip-flop 910 at a timing of a Hi transition of the synchronous clock signal, storing the state in the selection-signal flip-flop 910, and outputting the state.

The next part illustrates the sawtooth-wave signal Saw with a solid line, the duty-instruction voltage signal Vd with a broken line, and an intersection at which the potential of the sawtooth-wave signal Saw exceeds the potential of the duty-instruction voltage signal Vd with a black circle. The sawtooth-wave signal Saw is generated by selecting the first sawtooth-wave signal Saw0 when the selection signal Phipx is Low and selecting the second sawtooth-wave signal Saw1 when the selection signal Phipx is Hi.

The next part illustrates the PWM reset signal Rn. The PWM reset signal Rn is Low when the potential of the sawtooth-wave signal Saw is higher than the potential of the duty instruction voltage signal Vd, that is, becomes Low at the timing of the black circle, and is Hi at other times, that is, becomes Hi at a timing at which the sawtooth-wave signal Saw is reset.

The lowermost part illustrates the PWM signal Pwmp. The PWM signal Pwmp becomes Hi at a timing at which the synchronous clock signal Clkx becomes Hi, and becomes Low when the PWM reset signal Rn is Low. When the potential of the duty-instruction voltage signal Vd is higher than the top potential Vtop as illustrated in the right end part of FIG. 7, the PWM reset signal Rn does not become Low. In this case, the PWM signal Pwmp is maintained at Hi. In this manner, according to the present embodiment, it is possible to generate the PWM signal Pwmp having a wide pulse width that is close to a duty of 100%. More specifically, it is possible to reduce a Low pulse width of the PWM signal Pwmp to a limit on which a flip-flop can respond.

As described above, the switching power supply 100 according to the present embodiment outputs a stable output power even when an input power-supply voltage drops to a substantially equal level to an output power-supply voltage.

Third Embodiment

The switching power supply 100 according to a third embodiment changes an amplitude range of a high-linearity sawtooth-wave signal output from the sawtooth wave generator 9 in accordance with a state of the PWM signal Pwmp to stably change a Hi pulse width duty D (Equation (2)) from 0% to 100%. In the following descriptions, differences between the switching power supply 100 according to the third embodiment and the switching power supply 100 according to the second embodiment are explained.

Figure 8:
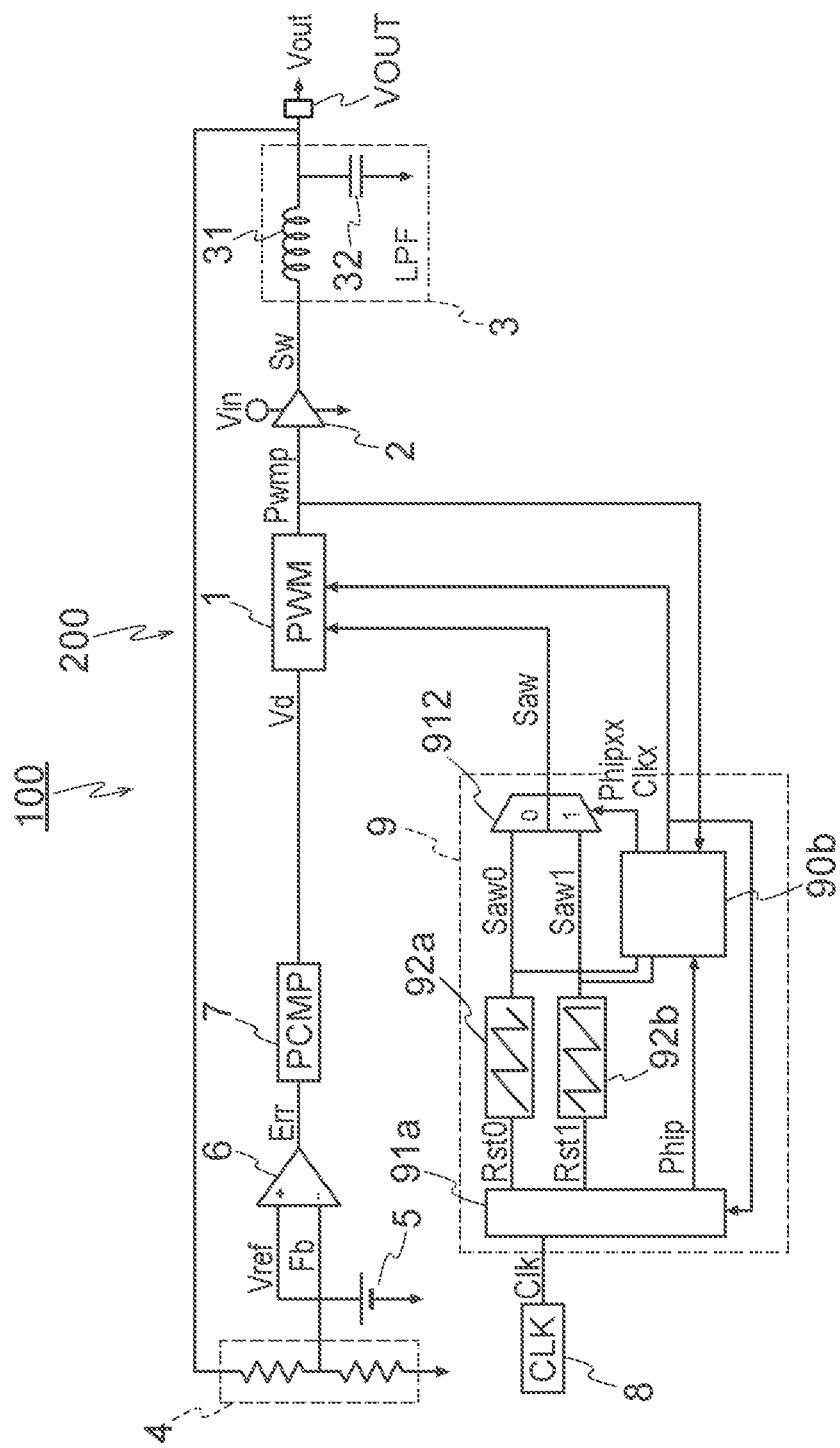
FIG. 8 is a diagram illustrating a configuration example of a switching power supply according to a third embodiment.

FIG. 8 is a diagram illustrating a configuration example of the switching power supply 100 according to the third embodiment. As illustrated in FIG. 8, the switching power supply 100 according to the third embodiment is different from the switching power supply 100 according to the second embodiment illustrated in FIG. 4 in that the PWM signal Pwmp output from the PWM circuit 1 is fed back to a voltage detector 90b.

More specifically, the voltage detector 90b changes a transition timing of a state of a cutout signal Phipxx in accordance with the state of the PWM signal Pwmp. With this change, the voltage detector 90b changes the amplitude range of the sawtooth-wave signal Saw output from the sawtooth wave generator 9.

Figure 9:
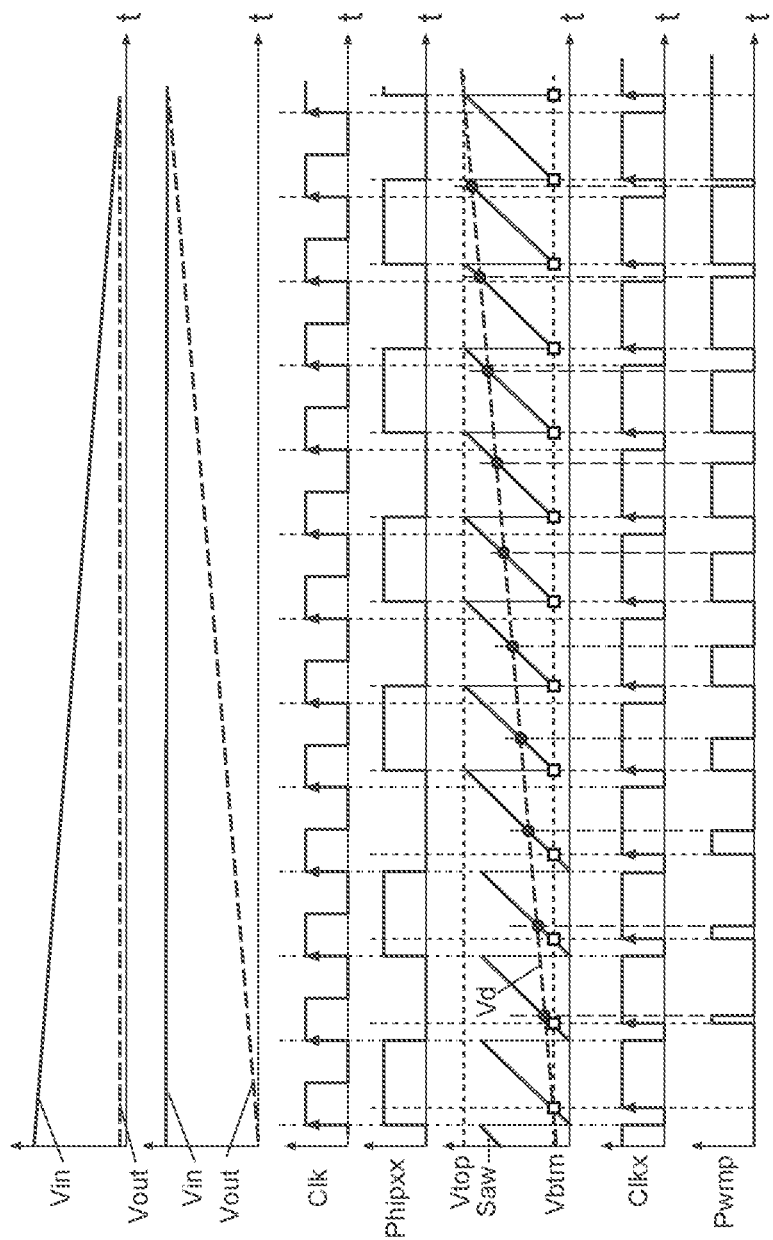
FIG. 9 is a diagram of operation waveforms of the switching power supply according to the third embodiment.

FIG. 9 is a diagram of operation waveforms of the switching power supply 100 according to the third embodiment. FIG. 9 illustrates, from the top along the vertical axis, the input power-supply voltage Vin, the output power-supply voltage Vout, the input power-supply voltage Vin, the output power-supply voltage Vout, the clock signal Clk, the cutout signal Phipxx, the top potential Vtop, the first sawtooth-wave signal Saw0, the sawtooth-wave signal Saw, the duty-instruction voltage signal Vd, the bottom potential Vbtm, the synchronous clock signal Clkx, and the PWM signal Pwmp. The horizontal axis represents a time.

That is, the uppermost part illustrates a change of the input power-supply voltage Vin with a solid line and the output power-supply voltage Vout with a broken line. In this manner, the switching power supply 100 according to the third embodiment can output the stable output power Vout even when the input power-supply voltage Vin changes from a high voltage that is ten times higher than the output power-supply voltage Vout to a substantially equal voltage.

The next part illustrates the input power-supply voltage Vin with a solid line and the output power-supply voltage Vout with a broken line. In this manner, the switching power supply 100 according to the third embodiment can change and output the output power-supply voltage Vout from 0 V to a voltage that is substantially equal to the input power supply.

The next part illustrates the clock signal Clk. The clock signal Clk is a rectangular-wave signal having a constant period.

The next part illustrates the cutout signal Phipxx. The cutout signal Phipxx is a ½-divided rectangular-wave signal a state of which changes at a Hi transition timing of the clock signal Clk when a Hi duty of the PWM signal Pwmp described later is smaller than a predetermined value, and the state of which changes at a reset timing of the sawtooth-wave signal Saw when the Hi duty of the PWM signal Pwmp is equal to or larger than a predetermined value.

The next part illustrates the sawtooth-wave signal Saw with a solid line. The sawtooth-wave signal Saw is generated by selectively cutting out one of the two sawtooth-wave signals Saw0 and Saw1 (not illustrated) by the cutout signal Phipxx. In the same part, the duty-instruction voltage signal Vd is illustrated with a broken line, an intersection at which the potential of the sawtooth-wave signal Saw exceeds the potential of the duty-instruction voltage signal Vd is marked with a black circle, and an intersection of the sawtooth-wave signal Saw and the bottom potential Vbtm or a reset timing of the sawtooth-wave signal Saw is marked with a square.

The next part illustrates the synchronous clock signal Clkx. The synchronous clock signal Clkx is a rectangular-wave signal that transitions to Hi at the timing of the square described above and transitions to Low at the Hi transition timing of the clock signal Clk.

The lowermost part illustrates the PWM signal Pwmp. The PWM signal Pwmp transitions to Hi at a timing of a transition of the synchronous clock signal Clkx to Hi (at the timing of the square in FIG. 9), and transitions to Low at a timing at which the potential of the sawtooth-wave signal Saw exceeds the potential of the duty-instruction voltage signal Vd (at the timing of the black circle in FIG. 9). When the potential of the duty-instruction voltage signal Vd is lower than the bottom potential Vbtm as in a left end part of FIG. 9, no Hi pulse of the PWM signal Pwmp is generated and the PWM signal Pwmp is maintained at Low. When the potential of the duty-instruction voltage signal Vd then exceeds the bottom potential Vbtm slightly, the PWM signal Pwmp becomes a rectangular-wave signal having a very narrow Hi pulse width.

On the contrary, when the potential of the duty-instruction voltage signal Vd is higher than the top potential Vtop as in a right end part of FIG. 9, the PWM signal Pwmp is a 100%-duty rectangular-wave signal, that is, is maintained at Hi. Further, when the potential of the duty-instruction voltage signal Vd becomes slightly lower than the top potential Vtop, the PWM signal Pwmp becomes a rectangular-wave signal that becomes Low momentarily and has a duty of nearly 100%.

Figure 10:
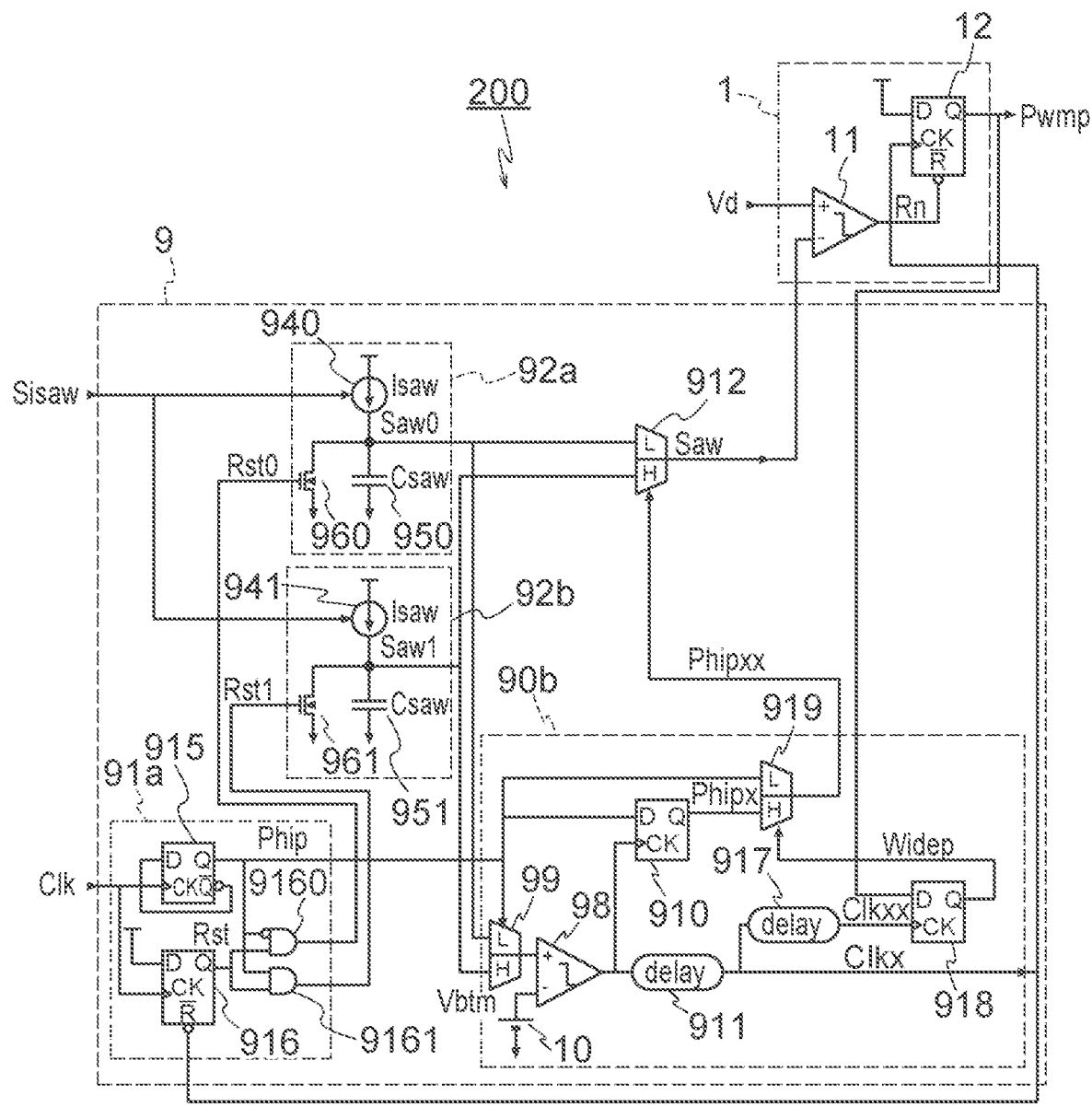
FIG. 10 is a diagram illustrating a detailed configuration example of a sawtooth-wave output circuit and a PWM circuit according to the third embodiment.

FIG. 10 is a diagram illustrating a detailed configuration example of the sawtooth wave generator 9 and the PWM circuit 1 according to the third embodiment. As illustrated in FIG. 10, the configuration of the voltage detector 90b is different from that of the voltage detector 90a according to the second embodiment. That is, the voltage detector 90b is different from the voltage detector 90a in further including a determination delay circuit 917, a wide-pulse-width determination flip-flop 918, and a switch 919.

FIG. 10 is different from FIG. 6 in further illustrating a wide-pulse-determination synchronous clock signal Clkxx and a wide-pulse-width determination signal Widep.

The determination delay circuit 917 receives the synchronous clock signal Clkx, adds a delay longer than a response time of the comparator 98 and the comparator 11 to it, and outputs the wide-pulse-determination synchronous clock signal Clkxx. In the wide-pulse-width determination flip-flop 918, the wide-pulse-determination synchronous clock signal Clkxx is input to a clock input terminal CK and the PWM signal Pwmp is input to a data terminal D. The wide-pulse-width determination flip-flop 918 takes in a state of the PWM signal Pwmp at a timing of a transition of the wide-pulse-determination synchronous clock signal Clkxx to Hi, and outputs that state as the wide-pulse-width determination signal Widep. Accordingly, the wide-pulse-width determination flip-flop 918 sets the wide-pulse-width determination signal Widep to Hi when the potential of the duty-instruction voltage signal Vd is higher than the bottom potential Vbtm by a predetermined value or more, and sets it to Low at other times. That is, the wide-pulse-width determination signal Widep is Hi when a pulse width of a rectangular-wave signal is wide, and is Low when the pulse width of the rectangular-wave signal is narrow.

The wide-pulse-width determination signal Widep is input to a selection terminal of the switch 919. The switch 919 selects the selection signal Phipx output from the selection-signal flip-flop 910 when the wide-pulse-width determination signal Widep is Hi, and outputs the selection signal Phipx as the cutout signal Phipxx to the selector 912. On the other hand, when the wide-pulse-width determination signal Widep is Low, the switch 919 selects the phase signal Phip output from the input-signal divider 915, and outputs the phase signal Phip as the cutout signal Phipxx to the selector 912.

Accordingly, the selector 912 switches a range of the first sawtooth-wave signal Saw0 and a range of the second sawtooth-wave signal Saw1 in accordance with the period of the clock signal Clk, and outputs the selected one to the sawtooth-wave signal Saw. More specifically, the selector 912 selects the first sawtooth-wave signal Saw0 or the second sawtooth-wave signal Saw1 in a range including a signal component equal to or lower than the bottom potential Vbtm when the pulse width of the PWM signal Pwmp is smaller than a predetermined value (the wide-pulse-width determination signal Widep is Low), and selects the first sawtooth-wave signal Saw0 or the second sawtooth-wave signal Saw1 in a range from the bottom potential Vbtm to the top potential Vtop when the pulse width of the PWM signal Pwmp is a predetermined value or more (the wide-pulse-width determination signal Widep is Hi).

Figure 11:
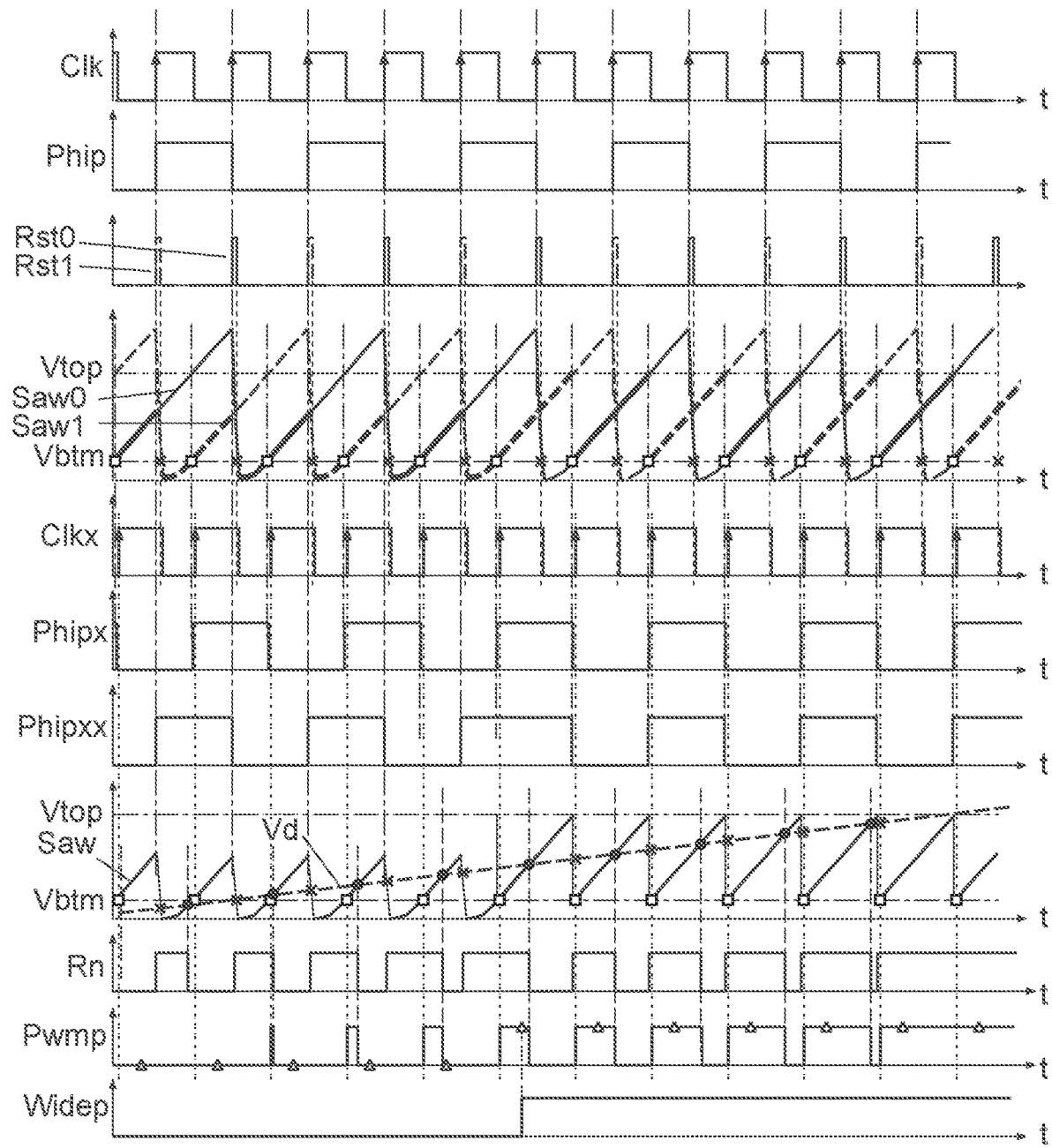
FIG. 11 is a diagram of detailed operation waveforms of the switching power supply according to the third embodiment.

FIG. 11 is a diagram of detailed operation waveforms of the switching power supply 100 according to the third embodiment. FIG. 11 illustrates, from the top along the vertical axis, the clock signal Clk, the phase signal Phip, the first reset signal Rst0, the second reset signal Rst1, the top potential Vtop, the first sawtooth-wave signal Saw0, the second sawtooth-wave signal Saw1, the bottom potential Vbtm, the synchronous clock signal Clkx, the selection signal Phipx, the cutout signal Phipxx, the top potential Vtop, the sawtooth-wave signal Saw, the duty-instruction voltage signal Vd, the bottom potential Vbtm, the PWM reset signal Rn, the PWM signal Pwmp, and the wide-pulse-width determination signal Widep. The horizontal axis represents a time.

That is, waveforms of the clock signal Clk illustrated in the uppermost part to the selection signal Phipxx illustrated in the sixth part from the top are the same as those in the operation waveform diagram in the second embodiment (FIG. 7), and therefore descriptions thereof are omitted.

The next part illustrates the cutout signal Phipxx. The cutout signal Phipxx is a rectangular-wave signal that transitions at the same timing as the phase signal Phip when the wide-pulse-width determination signal Widep described later is Low, and a rectangular-wave signal that and transitions at the same timing as the selection signal Phipx when the wide-pulse-width determination signal Widep is Hi.

The next part illustrates the sawtooth-wave signal Saw with a solid line and the duty-instruction voltage signal Vd with a broken line. Further, an intersection at which the potential of the sawtooth-wave signal Saw exceeds the potential of the duty-instruction voltage signal Vd is denoted with a black circle, and an intersection at which the potential of the sawtooth-wave signal Saw becomes lower than the potential of the duty-instruction voltage signal Vd is denoted with a cross.

Further, an intersection at which the potential of the sawtooth-wave signal Saw becomes lower than the bottom potential Vbtm is denoted with a square.

The sawtooth-wave signal Saw has a waveform obtained by selecting the first sawtooth-wave signal Saw0 and cutting out a portion thereof when the cutout Phipxx is Low, and has a waveform obtained by selecting the second sawtooth-wave signal Saw1 and cutting out a portion thereof when the cutout signal Phipxx is Hi. Accordingly, when the pulse width of the PWM signal Pwmp is narrow, that is, the wide-pulse-width determination signal Widep is Low, the sawtooth-wave signal Saw is a signal the potential of which rises from a grounding power-supply voltage of 0 V and is reset again to the grounding power-supply voltage of 0 V before reaching the top potential Vtop. On the other hand, when the pulse width of the PWM signal Pwmp is wide, that is, the wide-pulse-width determination signal Widep is Hi, the sawtooth-wave signal Saw is a signal the potential of which rises from the bottom potential Vbtm at a constant rate and is reset again to the bottom potential Vbtm when reaching the top potential Vtop. In both cases, a timing at which the potential of the sawtooth-wave signal Saw exceeds the bottom potential Vbtm matches with a timing of a transition of the synchronous clock signal Clkx to Hi. That is, the period of the square is constant.

The next part illustrates the PWM reset signal Rn. The PWM reset signal Rn becomes Hi at the timing of the cross when the potential of the sawtooth-wave signal Saw becomes lower than the potential of the duty instruction voltage signal Vd, and is Low at other times at the timing of the black circle. Here, when the wide-pulse-width determination signal Widep is Low, the sawtooth-wave signal Saw includes the signal component equal to or lower than the bottom potential Vbtm. Therefore, it is possible to stably detect the timing at which the potential of the sawtooth-wave signal Saw exceeds the potential of the duty-instruction voltage signal Vd even if the potential of the duty-instruction voltage signal Vd is near the bottom potential Vbtm or is equal to or lower than the bottom potential Vbtm, so that PWM reset signal Rn is always generated. On the other hand, when the wide-pulse-width determination signal Widep is Hi, the highest potential of the sawtooth-wave signal Saw is the top potential Vtop. Therefore, when the duty-instruction voltage signal Vd becomes slightly lower than the top potential Vtop, the PWM reset signal Rn having a very narrow Low pulse. On the contrary, when the duty-instruction voltage signal Vd exceeds the top potential Vtop, the Low pulse is eliminated and the PWM reset signal Rn is maintained at Hi.

The next part illustrates the PWM signal Pwmp. The PWM signal Pwmp is set to Hi at a timing at which the synchronous clock signal Clkx becomes Hi, and is reset to Low when the PWM reset signal Rn is Low. Because the period of a transition of the synchronous clock signal Clkx to Hi is kept constant, the period of a transition of the PWM signal Pwmp to Hi is also kept constant. Meanwhile, a timing of a transition of the PWM reset signal Rn to Low is changed in accordance with the potential of the duty-instruction voltage signal Vd. That is, the pulse width of the PWM signal Pwmp is changed in accordance with the potential of the pulse-width instruction voltage signal Vd.

Further, when the potential of the duty-instruction voltage signal Vd becomes lower than the bottom potential Vbtm as illustrated in a left end part of the operation waveform diagram of FIG. 11, the order of the timing of the square and the timing of the black circle is reversed, so that the black circle appears before the square. That is, the synchronous clock signal Clkx transitions to Hi while the PWM reset signal Rn is Low. At this time, because the flip-flop 12 gives priority to an input to the reset terminal R because of a transition of the clock input terminal CL, the PWM signal Pwmp is maintained at Low. However, when the potential of the duty-instruction voltage signal Vd becomes slightly higher than the bottom potential Vbtm and the square appears prior to the black circle even momentarily, the PWM signal Pwmp having a very short Hi pulse width that corresponds to the difference between these marks is output.

As described above, because the sawtooth-wave signal Saw includes a signal component equal to or lower than the bottom potential Vbtm when the wide-pulse-width determination signal Widep is Low, it is possible to generate the PWM signal Pwmp having a very narrow pulse width and to stably output the output power-supply voltage Vout having a high step-down ratio. Further, in a case where the potential of the duty-instruction voltage signal Vd is equal to or lower than the bottom potential Vbtm, it is possible to maintain the PWM signal Pwmp at Low or to maintain the output power-supply voltage Vout at 0 V.

On the contrary, under a condition where the input power-supply voltage Vin and the output power-supply voltage Vout are substantially equal to each other as illustrated in a right end part of the operation waveform diagram of FIG. 11, the wide-pulse-width determination signal Widep is Hi and the highest potential of the sawtooth-wave signal Saw is the top potential Vtop. Accordingly, when the potential of the duty-instruction voltage signal Vd comes close to the top potential Vtop, the PWM signal Pwmp in which a Low-duration is very short is generated.

Further, when the potential of the duty instruction voltage signal Vd exceeds the top potential Vtop, the black circle is eliminated and the PWM reset signal Rn does not become Low. Therefore, the PWM signal Pwmp is maintained at Hi and its duty is 100%.

The lowermost part illustrates the wide-pulse-width determination signal Widep. The wide-pulse-width determination flip-flop 918 latches a state of the PWM signal Pwmp at a timing of a triangle after a delay added by the determination delay circuit 917 after the synchronous clock signal Clkx transitions to Hi, and generates the wide-pulse-width determination signal Widep. That is, in a case where the PWM signal Pwmp is at Hi at the timing of the triangle, it is determined that the pulse width is wide, so that the wide-pulse-width determination signal Widep becomes Hi. Meanwhile, in a case where the PWM signal Pwmp has been reset to Low at the timing of the triangle, it is determined that the pulse width is narrow, so that the wide-pulse-width determination signal Widep is Low.

As described above, the switching power supply 100 according to the present embodiment switches an amplitude of the sawtooth-wave signal Saw in accordance with a pulse width of the PWM signal Pwmp which is determined by the wide-pulse-width determination flip-flop 918. Accordingly, when the wide-pulse-width determination signal Widep is Low, the sawtooth-wave signal Saw includes a signal component that is equal to or lower than the bottom potential Vbtm. Consequently, when the potential of the pulse-width instruction voltage signal Vd is substantially as low as the bottom potential Vbtm, it is possible to stably generate the PWM signal Pwmp having a very narrow pulse width. Further, in a case where the potential of the pulse-width instruction voltage signal Vd is equal to or lower than the bottom potential Vbtm, the duty of the PWM signal Pwmp is 0%.

On the other hand, when the wide-pulse-width determination signal Widep is Hi, a range in which the sawtooth-wave signal Saw is cut out is changed in such a manner that the highest potential of the sawtooth-wave signal Saw becomes the top potential Vtop. Accordingly, when the potential of the duty-instruction voltage signal Vd is slightly lower than the top potential Vtop, the PWM reset signal Rn having a very narrow Low pulse width is generated. The flip-flop 12 sets the PWM signal Pwmp to Low in response to the PWM reset signal Rn having a very narrow Low pulse width, and sets the PWM signal Pwmp to Hi again in response to the next transition of the synchronous clock signal Clkx to Hi occurring after a short time. Here, the timing of the clock signal Clkx to Hi and a timing at which the sawtooth-wave signal Saw is reset from the top potential Vtop to the sawtooth-wave bottom potential Vbtm are adjusted by the delay circuit 911 to match with each other. Therefore, it is possible to stably generate the PWM signal Pwmp having a wide pulse width that is close to a duty of 100%. Further, when the potential of the duty-instruction voltage signal Vd exceeds the top potential Vtop, the duty of the PWM signal Pwmp becomes 100%.

As described above, according to the present embodiment, the duty of the PWM signal Pwmp can be continuously controlled from 0% to 100%. Therefore, in an input power supply that handles a wide range from a voltage substantially equal to an output power-supply voltage to a high voltage that exceeds ten times the output power-supply voltage, it is possible to provide a buck switching power supply that operates stably. Alternatively, it is possible to provide a buck switching power supply that stably outputs an output power in a wide voltage range from 0 V to a voltage substantially equal to an input power-supply voltage.

Fourth Embodiment

The switching power supply 100 according to a fourth embodiment is different from the switching power supply 100 according to the third embodiment in that a voltage detector 90c is additionally provided with a sawtooth-wave top-potential adjusting function and an automatic adjusting function that makes waveforms of the first sawtooth-wave signal Saw0 and the second sawtooth-wave signal Saw1 coincident with each other. In the following descriptions, differences between the switching power supply 100 according to the fourth embodiment and the switching power supply 100 according to the third embodiment are explained.

Figure 12:
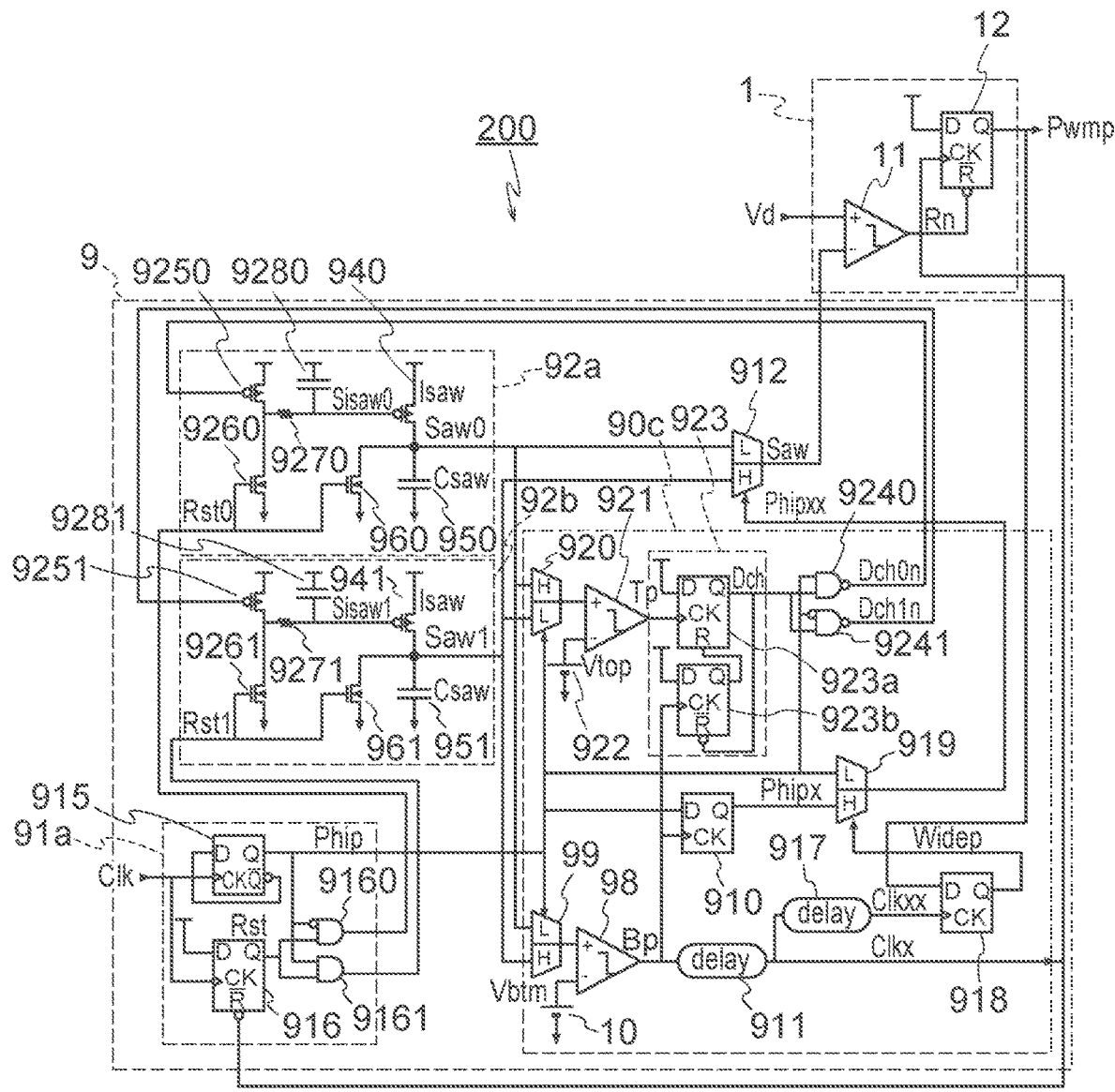
FIG. 12 is a diagram illustrating a detailed configuration example of a sawtooth-wave output circuit and a PWM circuit according to a fourth embodiment.

FIG. 12 is a diagram illustrating a detailed configuration example of the sawtooth wave generator 9 and the PWM circuit 1 according to the fourth embodiment.

As illustrated in FIG. 12, the configuration of the voltage detector 90c is different from that of the voltage detector 90b according to the third embodiment illustrated in FIG. 10. More specifically, the voltage detector 90c further includes a top-potential detecting selector 920, a top-potential detecting comparator 921, a top-potential reference voltage source 922, a suppression pulse generator 923, a first suppression pulse generator 9240, and a second suppression pulse generator 9241. FIG. 10 further illustrates a first control signal Sisaw0, a second control signal Sisaw1, the top potential Vtop, a suppression pulse signal Dch, a first suppression pulse signal Dch0n, and a second suppression pulse signal Dch1n. The first sawtooth wave generator 92a and the second sawtooth wave generator 92b correspond to an adjuster.

The first sawtooth wave generator 92a further includes a first speed-suppressing PMOS transistor 9250, a first speed-enhancing NMOS transistor 9260, a first change resistor 9270, and a first retention capacity 9280. The second sawtooth wave generator 92b further includes a second speed-suppressing PMOS transistor 9251, a second speed-enhancing NMOS transistor 9261, a second change resistor 9271, and a second retention capacity 9281.

First, the detailed configuration of the voltage detector 90c is described. The phase signal Phip is input to a selection signal terminal of the top-potential detecting selector 920. The top-potential detecting selector 920 selects the first sawtooth-wave signal Saw0 when the phase signal Phip is Hi, selects the second sawtooth-wave signal Saw1 when the phase signal Phip is Low, and outputs the selected signal.

In the top-potential detecting comparator 921, the first sawtooth-wave signal Saw0 or the second sawtooth-wave signal Saw1, selected by the top-potential detecting selector 920, is input to a non-inverting input terminal, and the top potential Vtop generated by the top-potential reference voltage source 922 is input to an inverting input terminal. The top-potential detecting comparator 921 sets a top-potential detection signal Tp to Hi and outputs it when the selected first or second sawtooth-wave signal Saw or Saw1 is higher than the top potential Vtop, and sets the top-potential detection signal Tp to Low and outputs it at other times.

In the comparator 98, the first sawtooth-wave signal Saw0 or the second sawtooth-wave signal Saw1, selected by the bottom-potential detecting selector 99, is input to a non-inverting input terminal, and the bottom potential Vbtm generated by the reference voltage source 97 is input to an inverting input terminal.

The comparator 98 sets a bottom-potential detection signal Bp to Hi and outputs it when the selected first or second sawtooth-wave signal Saw or Saw1 is higher than the bottom potential Vbtm, and sets the bottom-potential detection signal Bp to Low and outputs it at other times.

The suppression pulse generator 923 sets the suppression pulse signal Dch to Hi and outputs it in response to a transition of the top-potential detection signal Tp to Hi, and sets the suppression pulse signal Dch to Low and outputs it in response to a transition of the bottom-potential detection signal Bp to Hi.

The suppression pulse generator 923 is configured by two flip-flops 923a and 923b.

In the flip-flop 923a, the top-potential detection signal Tp is input to a clock input terminal CK, a signal that is always Hi is input to a signal terminal D, and an output signal of the flip-flop 923b is input to a reset terminal RN. In the other flip-flop 923b, the bottom-potential detection signal Bp output by the comparator 98 is input to a clock input terminal CK, a signal that is always Hi is input to a signal terminal D, and an inverted signal of the suppression pulse signal Dch is input to a reset terminal RN.

Accordingly, the suppression pulse generator 923 serves as a high-speed RS latch that operates in response to a transition of an input signal thereto to Hi. That is, the suppression pulse generator 923 can detect a small timing difference between a transition of the top-potential detection signal Tp to Hi and a transition of the bottom-potential detection signal Bp to Hi to generate the suppression pulse signal Dch having a very narrow Hi pulse width.

The phase signal Phip and the suppression pulse signal Dch are input to the first suppression pulse generator 9240. The first suppression pulse generator 9240 inverts the suppression pulse signal Dch to output the first suppression pulse signal Dch0$n$ when the phase signal Phip is Hi, and maintains the first suppression pulse signal Dch0$n$ at Hi when the phase signal Phip is Low.

The phase signal Phip is input to the second suppression pulse generator 9241 while being inverted. The suppression pulse signal Dch is also input to the second suppression pulse generator 9241. The second suppression pulse generator 9241 inverts the suppression pulse signal Dch to output the second suppression pulse signal Dch1$n$ when the phase signal Phip is Low, and maintains the second suppression pulse signal Dch1$n$ at Hi when the phase signal Phip is Hi.

In the first speed-suppressing PMOS transistor 9250, the first suppression pulse signal Dch0$n$ is input to a gate terminal while being inverted. The first speed-suppressing PMOS transistor 9250 is conductive when the first suppression pulse signal Dch0$n$ is Low, and discharges the first retention capacity 9280 to a power-supply potential connected to a source terminal, via the first change resistor 9270 connected to a drain terminal.

Meanwhile, in the first speed-enhancing NMOS transistor 9260, the first reset signal Rst0 is input to a gate terminal. The first speed-enhancing NMOS transistor 9260 is conductive when the first reset signal Rst0 is Hi, and charges the first retention capacity 9280 from a grounding power-supply potential of 0 V connected to a source terminal, via the first change resistor 9270 connected to a drain terminal.

A Low-duration of the first suppression pulse signal Dch0$n$ and a Hi-duration of the first reset signal Rst0 are each configured to be very short. In accordance with that short pulse duration, the charge amount stored in the first retention capacity 9280 is adjusted, and the potential of the first control signal Sisaw0 is controlled.

Similarly, in the second speed-suppressing PMOS transistor 9251, the second suppression pulse signal Dch1$n$ is input to a gate terminal while being inverted. The second speed-suppressing PMOS transistor 9251 is conductive when the second suppression pulse signal Dch1$n$ is Low, and discharges the second retention capacity 9281 to the power-supply potential connected to a source terminal, via the second change resistor 9271 connected to a drain terminal.

Meanwhile, in the second speed-enhancing NMOS transistor 9261, the second reset signal Rst1 is input to a gate terminal. The second speed-enhancing NMOS transistor 9261 is conductive when the second reset signal Rst1 is Hi, and charges the second retention capacity 9281 from the grounding power-supply potential of 0 V connected to a source terminal, via the second change resistor 9271 connected to a drain terminal.

A Low-duration of the second suppression pulse signal Dch1$n$ and a Hi-duration of the second reset signal Rst1 are each configured to be very short. In accordance with the short pulse duration, the charge amount stored in the second retention capacity 9281 is adjusted, and the potential of the second control signal Sisaw1 is controlled.

The first reset signal Rst0 and the second reset signal Rst1 are pulse signals that alternately become Hi at timings at which the clock signal Clk transitions to Hi. Hi pulse widths of these signals are very short and are equal to each other. Meanwhile, the first suppression pulse signal Dch0$n$ is an inverted pulse signal that is set to Low when the potential of the first sawtooth-wave signal Saw0 exceeds the top potential Vtop and is reset to Hi when the potential of the second sawtooth-wave signal Saw1 exceeds the bottom potential Vbtm. Similarly, the second suppression pulse signal Dch1$n$ is an inverted pulse signal that is set to Low when the potential of the second sawtooth-wave signal Saw1 exceeds the top potential Vtop and is reset to Hi when the potential of the first sawtooth-wave signal Saw0 exceeds the bottom potential Vbtm.

Therefore, the first suppression pulse signal Dch0$n$ and the second suppression pulse signal Dch1$n$ are pulse signals that alternately become Low immediately before transitions of the synchronous clock signal Clkx to Hi. These pulse widths change independently of each other in accordance with the highest potential of the first sawtooth-wave signal Saw0 and the highest potential of the second sawtooth-wave signal Saw1.

For example, in a case where the rate of potential rise of the first sawtooth-wave signal Saw0 is slow and the potential of the first sawtooth-wave signal Saw0 has not reached the top potential Vtop at a timing of the transition of the synchronous clock signal Clkx to Hi, the first suppression pulse signal Dch0$n$ is maintained at Hi and there is no Low-duration. On the contrary, in a case where the rate of potential rise of the first sawtooth-wave signal Saw0 is fast and the potential of the first sawtooth-wave signal Saw0 has already reached the top potential Vtop at the timing of the transition of the synchronous clock signal Clkx to Hi, the first suppression pulse signal Dch0$n$ is a pulse signal that is set to Low at a timing at which the potential of the first sawtooth-wave signal Saw0 reaches the top potential Vtop and is reset to Hi at the timing of the transition of the synchronous clock signal Clkx to Hi.

The potential of the first control signal Sisaw0 and the potential of the second control signal Sisaw1 are gradually reduced in response to the first reset signal Rst0 and the second reset signal Rst1, respectively. By controlling these control signals, the rate of sawtooth-wave potential rise of the first sawtooth-wave signal Saw0 and the rate of sawtooth-wave potential rise of the second sawtooth-wave signal Saw1 are increased at the same rate as each other.

Meanwhile, the potential of the first control signal Sisaw0 and the potential of the second control signal Sisaw1 gradually rise in response to the first suppression pulse signal Dch0$n$ and the second suppression pulse signal Dch1$n$, respectively. By controlling these control signals, the rising rate of the sawtooth-wave potential of the first sawtooth-wave signal Saw0 and the rising rate of the sawtooth-wave potential of the second sawtooth-wave signal Saw1 are reduced, and the reduction rates become faster as the respective rising rates of the sawtooth-wave potential become larger. With this operation, a first sawtooth-wave potential rising rate and a second sawtooth-wave potential rising rate are automatically adjusted be the same as each other. In this manner, the first sawtooth wave generator 92a and the second sawtooth wave generator 92b each have a function of adjusting the rising rate of a corresponding one of the first and second sawtooth-wave signals Saw0 and Saw1 to make a difference between a timing at which the sawtooth-wave signal Saw output from the selector 912 reaches the predetermined top potential Vtop and a timing at which the sawtooth-wave signal Saw reaches the largest value constant.

Figure 13:
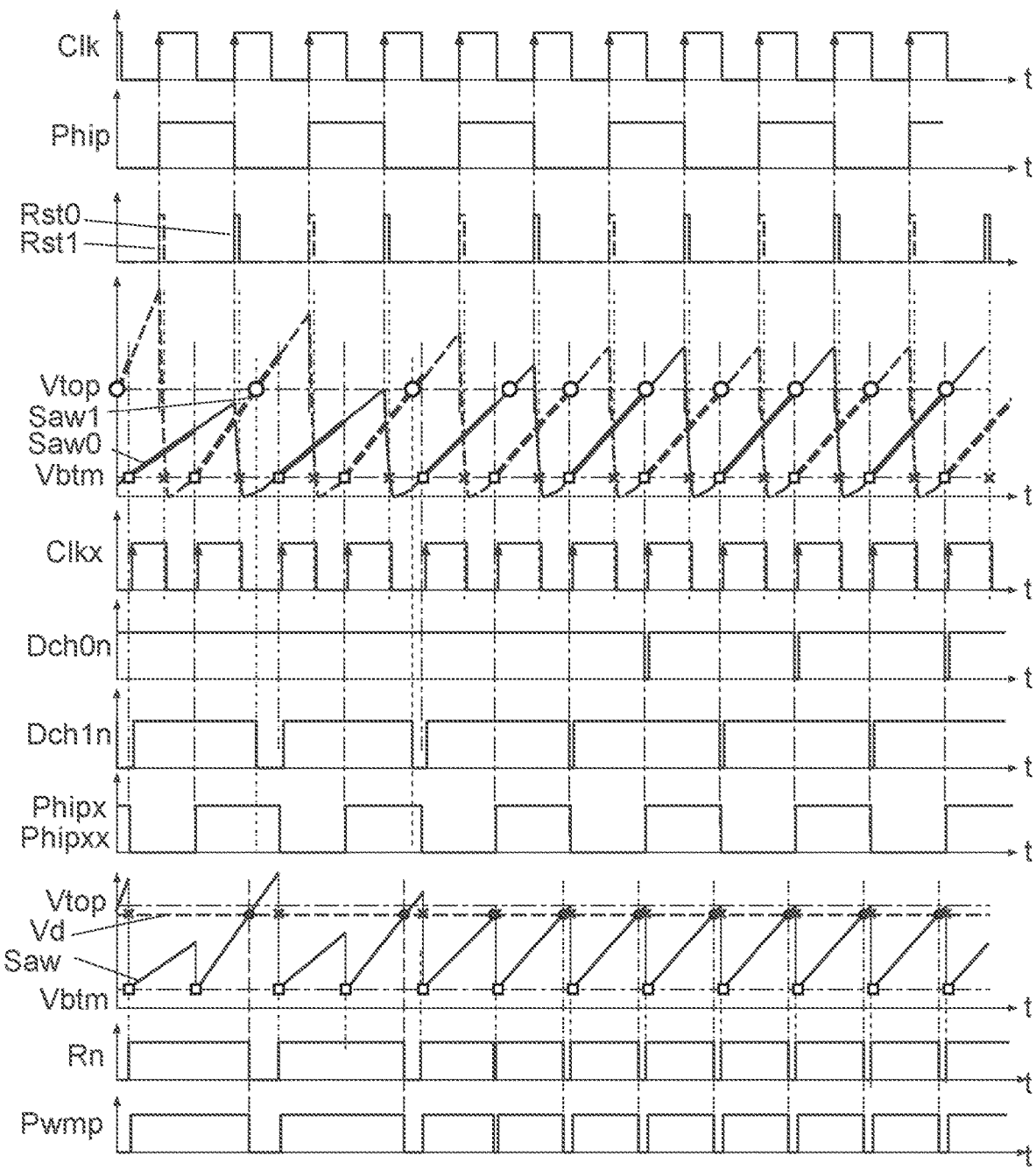
FIG. 13 is a diagram of operation waveforms of a switching power supply according to the fourth embodiment.

FIG. 13 is a diagram of operation waveforms of the switching power supply 100 according to the fourth embodiment. FIG. 13 illustrates, from the top along the vertical axis, the clock signal Clk, the phase signal Phip, the first reset signal Rst0, the second reset signal Rst1, the top potential Vtop, the second sawtooth-wave signal Saw1, the first sawtooth-wave signal Saw0, the bottom potential Vbtm, the synchronous clock signal Clkx, the first suppression pulse signal Dch0n, the second suppression pulse signal Dch1n, the selection signal Phipx, the cutout signal Phipxx, the top potential Vtop, the duty-instruction voltage signal Vd, the sawtooth-wave signal Saw, the bottom potential Vbtm, the PWM reset signal Rn, and the PWM signal Pwmp. The horizontal axis represents a time.

That is, the uppermost part illustrates the clock signal Clk. The clock signal Clk is a rectangular-wave signal having a constant period. In synchronization with a Hi transition timing of the clock signal Clk, the following signals operate.

The next part illustrates the phase signal Phip. The phase signal Phip is a divided signal the state of which transitions at the moment when the clock signal Clk becomes Hi.

The next part illustrates the first reset signal Rst0 with a solid line and the second reset signal Rst1 with a broken line.

The first reset signal Rst0 and the second reset signal Rst1 alternately transition to Hi at Hi transition timings of the clock signal Clk.

The next part illustrates the first sawtooth-wave signal Saw0 with a solid line, the second sawtooth-wave signal Saw1 with a broken line, and the bottom potential Vbtm with a dotted line. Further, that part illustrates an intersection at which the potential of the first sawtooth-wave signal Saw0 or the second sawtooth-wave signal Saw1 becomes lower than the bottom potential Vbtm with a cross, and an intersection at which the potential of the first sawtooth-wave signal Saw0 or the second sawtooth-wave signal Saw1 exceeds the bottom potential Vbtm with a square.

The first sawtooth-wave signal Saw0 is reset to a grounding power-supply potential when the first reset signal Rst0 is Hi. Similarly, the second sawtooth-wave signal Saw1 is reset to the grounding power-supply potential when the second reset signal Rst1 is Hi. These first and second reset signals Rst0 and Rst1 detect that the first sawtooth-wave signal Saw0 and the second sawtooth-wave signal Saw1 become the bottom potential Vbtm or lower, respectively, to automatically become Low.

At this time, the potential of the sawtooth-wave signal becomes substantially the grounding power-supply potential of 0 V because of delays generated by the comparator 98 and the synchronous-clock delay circuit 911. For a time period during which the first and second reset signals Rst0 and Rst1 are Low, the potential of each of the first and second sawtooth-wave signals Saw0 and Saw1 rises at a constant rate.

The next part illustrates the synchronous clock signal Clkx. While the phase signal Phip is Low, the synchronous clock signal Clkx becomes Hi when the potential of the first sawtooth-wave signal Saw0 exceeds the bottom potential Vbtm (at a timing of the square), and is Low at other times (becomes Low at a timing of the cross). Similarly, while the phase signal Phip is Hi, the synchronous clock signal Clkx becomes Hi when the potential of the second sawtooth-wave signal Saw1 exceeds the bottom potential Vbtm (at a timing of the square), and is Low at other times (becomes Low at a timing of the cross).

Attention is paid to the left part of FIG. 13 illustrating an operation initial stage, the rate of potential rise of the first sawtooth-wave signal Saw0 is slower than expected. On the other hand, the rate of potential rise of the second sawtooth-wave signal Saw1 is faster than expected. In FIG. 13, an intersection at which the first sawtooth-wave signal Saw0 or the second sawtooth-wave signal Saw1 exceeds the top potential Vtop is marked with a white circle. Because the rate of potential rise of the first sawtooth-wave signal Saw0 is slower than expected, the potential of the first sawtooth-wave signal Saw0 is reset to a ground potential of 0 V before reaching the top potential Vtop, and the white circle does not appear for a while. On the other hand, because the rate of potential rise of the second sawtooth-wave signal Saw1 is faster than expected, the white circle appears at a timing earlier than expected, and thereafter the potential of the second sawtooth-wave signal Saw1 also rises and exceeds the top potential Vtop.

The next part illustrates the first suppression pulse signal Dch0n, and the further next part illustrates the second suppression pulse signal Dch1n. The first suppression pulse signal Dch0n is set to Low at a timing of the white circle at which the potential of the first sawtooth-wave signal Saw0 exceeds the top potential Vtop and is reset to Hi at a timing of a square at which the potential of the second sawtooth-wave signal Saw1 exceeds the bottom potential Vbtm. Similarly, the second suppression pulse signal Dch1n is set to Low at a timing of the white circle at which the potential of the second sawtooth-wave signal Saw1 exceeds the top potential Vtop and is reset to Hi at a timing of the square at which the potential of the first sawtooth-wave signal Saw0 exceeds the bottom potential Vbtm.

Here, in the left part of FIG. 13 illustrating the operation initial stage, even if the rate of potential rise of the first sawtooth-wave signal Saw0 is slow and the potential of the first sawtooth-wave signal Saw0 does not reach the top potential Vtop or becomes higher than the top potential Vtop, the timing of the white circle appears later than the timing of the square and therefore the first suppression pulse signal Dch0n is not generated. On the other hand, because the rate of potential rise of the second sawtooth-wave signal Saw1 is fast and the potential of the second sawtooth-wave signal Saw1 reaches the top potential Vtop earlier than expected, the second suppression pulse signal Dch1n having a wide Low pulse width is generated.

Because the first suppression pulse signal Dch0n is not generated, there is only an action of the first reset signal Rst0, so that the rising rate of the first sawtooth-wave potential is increased. This operation is repeated, so that the pulse width of the first suppression pulse signal Dch0n becomes the same as the pulse width of the first reset signal Rst0 in due course and the first sawtooth-wave rising rate becomes stable. On the other hand, because an action of the second suppression pulse signal Dch1n having a wide pulse width is larger than an action of the second reset signal Rst1, the rising rate of the second sawtooth-wave potential is reduced. This operation is repeated, so that the pulse width of the second suppression pulse signal Dch1n becomes the same as the pulse width of the second reset signal Rst1 in due course and the second sawtooth-wave rising rate becomes stable. The first sawtooth-wave rising rate and the second sawtooth-wave rising rate are adjusted by alternately using a circuit that is common to the first and second sawtooth-wave signals. Therefore, the waveforms of the first sawtooth-wave signal Saw0 and the second sawtooth-wave signal Saw1 are automatically adjusted to completely match each other.

The next part illustrates the selection signal Phipx and the cutout signal Phipxx. The selection signal Phipx is generated by taking a state of the phase signal Phip into the selection-signal flip-flop 910 at a timing of a transition of the sawtooth-wave synchronous clock signal to Hi, storing the state in the selection-signal flip-flop 910, and outputting the state. Because the cutout signal Phipxx operates as the same timing as the selection signal Phipx, the waveform of the cutout signal Phipxx overlaps the waveform of the selection signal Phipx.

The next part illustrates the sawtooth-wave signal Saw with a solid line and the duty-instruction voltage signal Vd with a broken line. That part also illustrates an intersection at which the potential of the sawtooth-wave signal Saw exceeds the potential of the duty-instruction voltage signal Vd with a black circle. The sawtooth-wave signal Saw is generated by selecting the first sawtooth-wave signal Saw0 when the cutout signal Phipxx is Low and selecting the second sawtooth-wave signal Saw1 when the cutout signal Phipxx is Hi.

The next part illustrates the PWM reset signal Rn. The PWM reset signal Rn is Low when the potential of the sawtooth-wave signal Saw is higher than the potential of the duty instruction voltage signal Vd, that is, becomes Low at the timing of the black circle, and is Hi at other times, that is, becomes Hi at a timing at which the sawtooth-wave signal Saw is reset.

The lowermost part illustrates the PWM signal Pwmp. The PWM signal Pwmp becomes Hi at a timing at which the synchronous clock signal Clkx becomes Hi, and becomes Low when the PWM reset signal Rn is Low. Here, in the initial state in the left part of FIG. 13, the rate of potential rise of the first sawtooth-wave signal Saw0 and the rate of potential rise of the second sawtooth-wave signal Saw1 do not match with each other.

Because of this mismatch, there arises a trouble that the PWM signal Pwmp operates at a frequency that is a half of the frequency of the clock signal Clk or a wide pulse width and a narrow pulse width alternately appear. However, when the switching operation is repeated, the potential rising rate of the first sawtooth-wave signal Saw0 and the potential rising rate of the second sawtooth-wave signal Saw1 are automatically adjusted to completely match with each other in due course, so that the PWM signal Pwmp having a stable pulse width is generated.

As described above, the switching power supply 100 according to the present embodiment is configured to lower the potential of the first control signal Sisaw0 and the potential of the second control signal Sisaw1 at a predetermined rate by the first reset signal Rst0 and the second reset signal Rst1, respectively, and to increase a sawtooth-wave potential rising rate of the first sawtooth-wave signal Saw0 and a sawtooth-wave potential rising rate of the second sawtooth-wave signal Saw1 at the same rate.

Meanwhile, in a case where the sawtooth-wave potential rising rate of the first sawtooth-wave signal Saw0 is faster than expected, the first suppression pulse signal Dch0n is generated, so that the potential of the first control signal Sisaw0 is raised and the sawtooth-wave potential rising rate of the first sawtooth-wave signal Saw0 is decelerated. Similarly, in a case where the sawtooth-wave potential rising rate of the second sawtooth-wave signal Saw1 is faster than expected, the second suppression pulse signal Dch1n is generated, so that the potential of the second control signal Sisaw1 is raised and the sawtooth-wave potential rising rate of the second sawtooth-wave signal Saw1 is decelerated.

With these operations, the first sawtooth-wave potential rising rate and the second sawtooth-wave potential rising rate are automatically adjusted to be the same as each other. Accordingly, it is possible to generate a high-linearity sawtooth-wave signal having a period that matches with the period of the clock signal Clk and an amplitude that is in a desired voltage range.

According to the switching power supply of the present embodiment, it is possible to provide a switching power supply that operates more stably as compared with the switching power supply according to the third embodiment, for example.

Fifth Embodiment

The switching power supply 100 according to a fifth embodiment is a buck-boost switching power supply capable of generating both an output power of a lower voltage than an input power-supply voltage and an output power of a higher voltage than the input power-supply voltage. Its configuration is different from that of the switching power supply 100 according to the fourth embodiment in that two systems including a boost system and a buck system are provided, each including the PWM circuit 1, the selector 912, and a switching driver. In the following descriptions, differences between the switching power supply 100 according to the fifth embodiment and the switching power supply 100 according to the fourth embodiment are explained.

Figure 14:
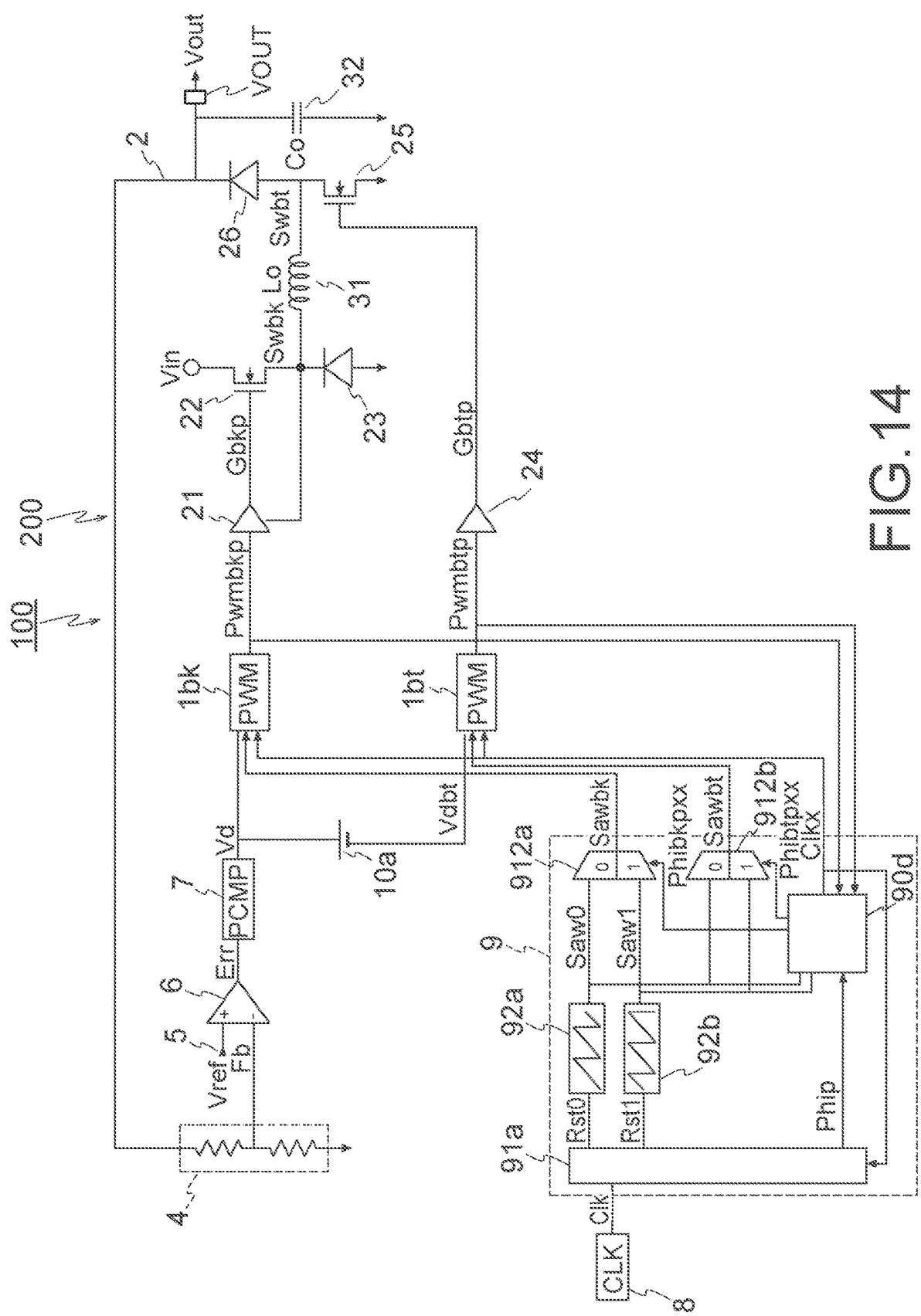
FIG. 14 is a diagram illustrating a configuration example of a switching power supply according to a fifth embodiment.

FIG. 14 is a diagram illustrating a configuration example of the switching power supply 100 according to the fifth embodiment. A buck system includes a buck PWM (PWM) 1*bk*, a buck switching pre-driver 21, a buck driver NMOS transistor 22, a buck asynchronous power diode 23, and a selector 912*a*.

Figure 15:
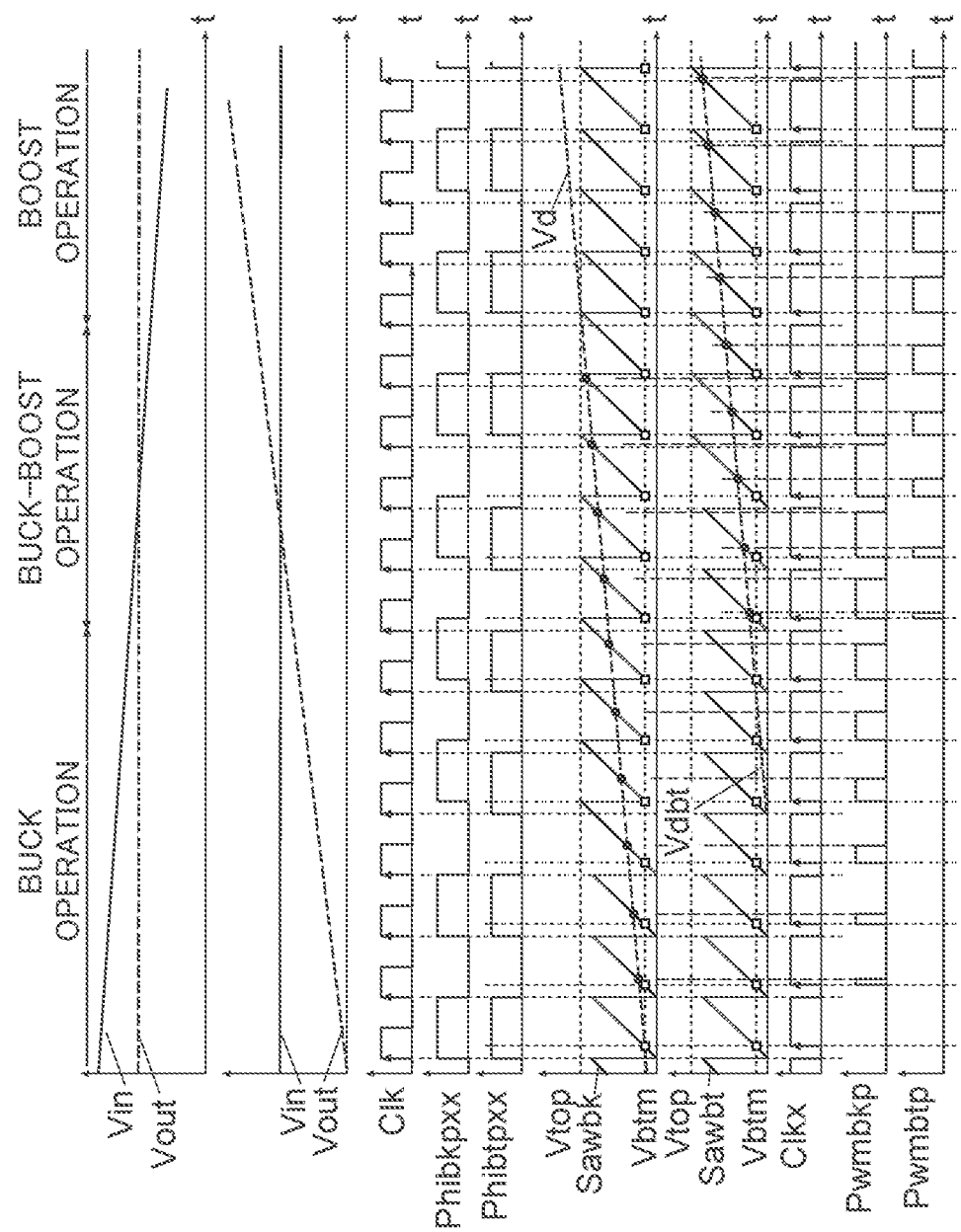
FIG. 15 is a diagram of operation waveforms of the switching power supply according to the fifth embodiment.

Meanwhile, a boost system includes a boost PWM (PWM) 1*bt*, a boost pre-driver 24, a boost driver NMOS transistor 25, and a boost asynchronous power diode 26. FIG. 15 further illustrates a buck PWM signal Pwmbkp, a boost PWM signal Pwmbtp, a buck gate signal Gbkp, a boost gate signal Gbtp, a boost duty-instruction voltage signal Vdbt, a boost sawtooth-wave signal Sawbt, and a buck sawtooth-wave signal Sawbk. The boost duty-instruction voltage signal Vdbt corresponds to a second pulse-width instruction voltage signal, and the boost PWM signal Pwmbtp corresponds to a second PWM signal. The buck driver NMOS transistor 22 corresponds to a first switching element, and the boost driver NMOS transistor 25 corresponds to a second switching element.

Further, a buck-boost duty-instruction gap voltage source 10*a* is newly provided between the buck system and the boost system. The buck PWM circuit 1*bk* modulates a Hi pulse width of the buck PWM signal Pwmbkp synchronized with the synchronous clock signal Clkx in response to the buck duty-instruction voltage signal Vd, and outputs the modulated signal.

Similarly, the boost PWM circuit 1*bt* modulates a Hi pulse width of the boost PWM signal Pwmbtp synchronized with the synchronous clock signal Clkx in response to the boost duty-instruction voltage signal Vdbt, and outputs the modulated signal.

The buck-boost duty-instruction gap voltage source 10a generates the boost duty-instruction voltage signal Vdbt obtained by stepping down the buck duty-instruction voltage signal Vd by a buck-boost gap voltage Vgap (not illustrated). Although the buck-boost duty-instruction gap voltage source 10a is illustrated by using an ideal voltage source, it can have any configuration as long as it can provide a potential difference that is equal to the buck-boost gap voltage Vgap.

The buck switching pre-driver 21 receives the buck PWM signal Pwmbkp and outputs the buck switching gate signal Gbkp. In the buck driver NMOS transistor 22, the buck switching gate signal Gbkp is input to a gate terminal, a buck switching node Swbk is connected to a source terminal, and an input power supply is connected to a drain terminal. The buck driver NMOS transistor 22 is placed in an on-state where a resistance between the source terminal and the drain terminal is very low when a potential at the gate terminal is higher than a potential at the source terminal, and in an off-state where the resistance between the source terminal and the drain terminal is very high at other times.

When the buck PWM signal Pwmbkp is Low, the potential of the buck switching gate signal Gbkp is equal to a potential of the buck switching node Swbk. Meanwhile, when the buck PWM signal Pwmbkp is Hi, the potential of the buck switching gate signal Gbkp is higher than the potential at the buck switching node Swbk. That is, the buck switching node Swbk is electrically connected to the input power supply when the buck PWM signal Pwmbkp is Hi, and is opened at other times.

The boost pre-driver 24 receives the boost PWM signal Pwmbtp as its input and outputs the boost gate signal Gbtp. In the boost driver NMOS transistor 25, the boost gate signal Gbtp is input to a gate terminal, a grounding power supply is connected to a source terminal, and the boost switching node Swbt is connected to a drain terminal. The boost driver NMOS transistor 25 is placed in an on-state where a resistance between the source terminal and the drain terminal is very low when a potential at the gate terminal is higher than a potential at the source terminal, and in an off-state where the resistance between the source terminal and the drain terminal is very high at other times.

When the boost PWM signal Pwmbtp is Low, the potential of the boost gate signal Gbkp is 0 V. When the boost PWM signal Pwmbtp is Hi, the potential of the boost gate signal Gbtp is Hi. That is, the boost switching node Swbt is electrically connected to the grounding power supply of 0 V when the boost PWM signal Pwmbtp is Hi, and is opened at other times. The buck switching node Swbk and the boost switching node Swbt are connected to each other via the current choke inductor 31.

The buck switching node Swbk is connected to a cathode terminal of the buck asynchronous power diode 23, and the grounding power supply is connected to an anode terminal.

Further, the output power-supply voltage Vout is connected to a cathode terminal of the boost asynchronous power diode 26, and the boost switching node Swbt is connected to an anode terminal.

A current flowing through the current choke inductor 31 is regulated by an on/off operation of the buck driver NMOS transistor 22 and an on/off operation of the boost driver NMOS transistor 25 described above, so that the output power-supply voltage Vout is output from the input power supply. The smoothing capacitor 32 is connected to the output power-supply voltage Vout, and its voltage is maintained to a predetermined value set by the voltage Vref of the reference voltage source 5 because of an action of a feedback control loop.

The sawtooth-wave signals Sawbk and Sawbt and the synchronous clock signal Clkx that is synchronized with these sawtooth-wave signals Sawbk and Sawbt are input to the buck PWM circuit 1bk. Similarly, the sawtooth-wave signals Sawbk and Sawbt and the synchronous clock signal Clkx that is synchronized with these sawtooth-wave signals Sawbk and Sawbt are input to the boost PWM circuit 1bt.

A buck cutout signal Phibkpxx is input to the selector 912a. The selector 912a cuts out the first sawtooth-wave signal Saw0 and outputs it as the buck sawtooth-wave signal Sawbk when the buck cutout signal Phibkpxx is Low, and cuts out the second sawtooth-wave signal Saw1 and outputs it as the buck sawtooth-wave signal Sawbk when the buck cutout signal Phibkpxx is Hi.

Similarly, a boost cutout signal Phibtpxx is input to the boost selector 912b. The selector 912b cuts out the first sawtooth-wave signal Saw0 and outputs it as the boost sawtooth-wave signal Sawbt when the boost cutout signal Phibtpxx is Low, and cuts out the second sawtooth-wave signal Saw1 and outputs it as the boost sawtooth-wave signal Sawbt when the boost cutout signal Phibtpxx is Hi.

The voltage detector 90d monitors a state of the buck PWM signal Pwmbkp and a state of the boost PWM signal Pwmbtp and outputs the buck cutout signal Phibkpxx and the boost cutout signal Phibtpxx.

FIG. 15 is a diagram of operation waveforms of the switching power supply 100 according to the fifth embodiment. FIG. 15 illustrates, from the top along the vertical axis, the input power-supply voltage Vin, the output power-supply voltage Vout, the input power-supply voltage Vin, the output power-supply voltage Vout, the clock signal Clk, the buck cutout signal Phibkpxx, the boost cutout signal Phibtpxx, the top potential Vtop, the buck sawtooth-wave signal Sawbk, the bottom potential Vbtm, the top potential Vtop, the boost sawtooth-wave signal Sawbt, the bottom potential Vbtm, the synchronous clock signal Clkx, the buck PWM signal Pwmbkp, and the boost PWM signal Pwmbtp. The horizontal axis represents a time.

That is, the uppermost part illustrates a change of the input power-supply voltage Vin of an input power supply with a solid line and the output power-supply voltage Vout with a broken line. In this manner, the input power-supply voltage Vin of the input power supply changes from a very high voltage that is ten times higher than the output power-supply voltage Vout to a voltage below a half of the output power-supply voltage Vout. Alternatively, the output power-supply voltage Vout is changed from 0 V to a high voltage that is twice larger than the constant voltage Vin of the input power supply, and is output as represented with a solid line in the next part.

The next part illustrates the clock signal Clk. The clock signal Clk is a rectangular-wave signal having a constant period as represented with a solid line.

The next part illustrates the buck cutout signal Phibkpxx. The buck cutout signal Phibkpxx is a ½-divided rectangular-wave signal the state of which changes at a Hi transition timing of the clock signal Clk when a Hi duty of the buck PWM signal Pwmbkp described later is smaller than a certain value. Further, the buck cutout signal Phibkpxx is a ½-divided rectangular-wave signal the state of which changes at a timing at which the buck sawtooth-wave signal Sawbk described later is reset when the Hi duty of the buck PWM signal Pwmbkp is larger than the certain value.

The next part illustrates the boost cutout signal Phibtpxx. The boost cutout signal Phibtpxx is a ½-divided rectangular-wave signal the state of which changes at the Hi transition timing of the clock signal Clk when a Hi duty of the boost PWM signal Pwmbtp described later is smaller than a certain value. Further, the boost cutout signal Phibtpxx is a ½-divided rectangular-wave signal the state of which changes at a timing at which the boost sawtooth-wave signal Sawbt is reset when the Hi duty of the boost PWM signal Pwmbtp is larger than the certain value.

In the next part, the buck sawtooth-wave signal Sawbk is illustrated with a solid line, the buck duty-instruction voltage signal Vd is illustrated with a broken line, an intersection at which the buck sawtooth-wave signal Sawbk exceeds the buck duty-instruction voltage signal Vd is marked with a black circle, and an intersection of the buck sawtooth-wave signal Sawbk and the bottom potential Vbtm or a reset timing of the buck sawtooth-wave signal Sawbk is marked with a square. The buck sawtooth-wave signal Sawbk is generated by selectively cutting out one of the two sawtooth-wave signals Saw0 and Saw1 (not illustrated) by the buck cutout signal Phibkpxx.

In the next part, the boost sawtooth-wave signal Sawbt is illustrated with a solid line, the boost duty-instruction voltage signal Vdbt is illustrated with a broken line, an intersection at which the boost sawtooth-wave signal Sawbt exceeds the boost duty-instruction voltage signal Vdbt is marked with a black circle, and an intersection of the boost sawtooth-wave signal Sawbt and the bottom potential Vbtm or a reset timing of the boost sawtooth-wave signal Sawbt is marked with a square. The boost sawtooth-wave signal Sawbt is generated by selectively cutting out one of the two sawtooth-wave signals Saw0 and Saw1 (not illustrated) by the boost cutout signal Phibtpxx.

The next part illustrates the synchronous clock signal Clkx. The synchronous clock signal Clkx is a rectangular-wave signal that transitions to Hi at the timing of the square described above and transitions to Low at the Hi transition timing of the clock signal Clk.

The next part illustrates the buck PWM signal Pwmbkp. The buck PWM signal Pwmbkp transitions to Hi at a timing of a transition of the synchronous clock signal Clkx to Hi (at the timing of the square in FIG. 15), and transitions to Low at a timing at which the potential of the buck sawtooth-wave signal Sawbk exceeds the potential of the buck duty-instruction voltage signal Vd (at the timing of the black circle in FIG. 15). When the potential of the duty-instruction voltage signal Vd is lower than the bottom potential Vbtm as in the left end part of FIG. 15, the buck PWM signal Pwmbkp is not generated and is maintained at Low. When the potential of the buck duty-instruction voltage signal Vd then exceeds the bottom potential Vbtm slightly, the buck PWM signal Pwmbkp becomes a rectangular-wave signal having a very narrow Hi pulse width.

On the contrary, when the potential of the buck duty-instruction voltage signal Vd is higher than the top potential Vtop as in the right end part of FIG. 15, the buck PWM signal Pwmbkp becomes a 100%-duty rectangular-wave signal, that is, is maintained at Hi. Further, when the potential of the buck duty-instruction voltage signal Vd is slightly lower than the top potential Vtop, the buck PWM signal Pwmbkp is a rectangular-wave signal that becomes Low momentarily and has a duty of nearly 100%.

Similarly, the lowermost row illustrates the boost PWM signal Pwmbtp. The boost PWM signal Pwmbtp transitions to Hi at a timing of a transition of the synchronous clock signal Clkx to Hi (at the timing of the square in FIG. 15), and transitions to Low at a timing at which the potential of the boost sawtooth-wave signal Sawbt exceeds the potential of the boost duty-instruction voltage signal Vdbt (at the timing of the black circle in FIG. 15). When the potential of the boost duty-instruction voltage signal Vdbt is lower than the bottom potential Vbtm as in the left end part of FIG. 15, no Hi pulse of the boost PWM signal Pwmbtp is generated and the boost PWM signal Pwmbt is maintained at Low. When the potential of the boost duty-instruction voltage signal Vdbt then exceeds the bottom potential Vbtm slightly, the boost PWM signal Pwmbtp becomes a rectangular-wave signal having a very narrow Hi pulse width.

Further, when the potential of the boost duty-instruction voltage signal Vdbt rises, the duty of the boost PWM signal Pwmbtp increases to 100%.

Figure 16:
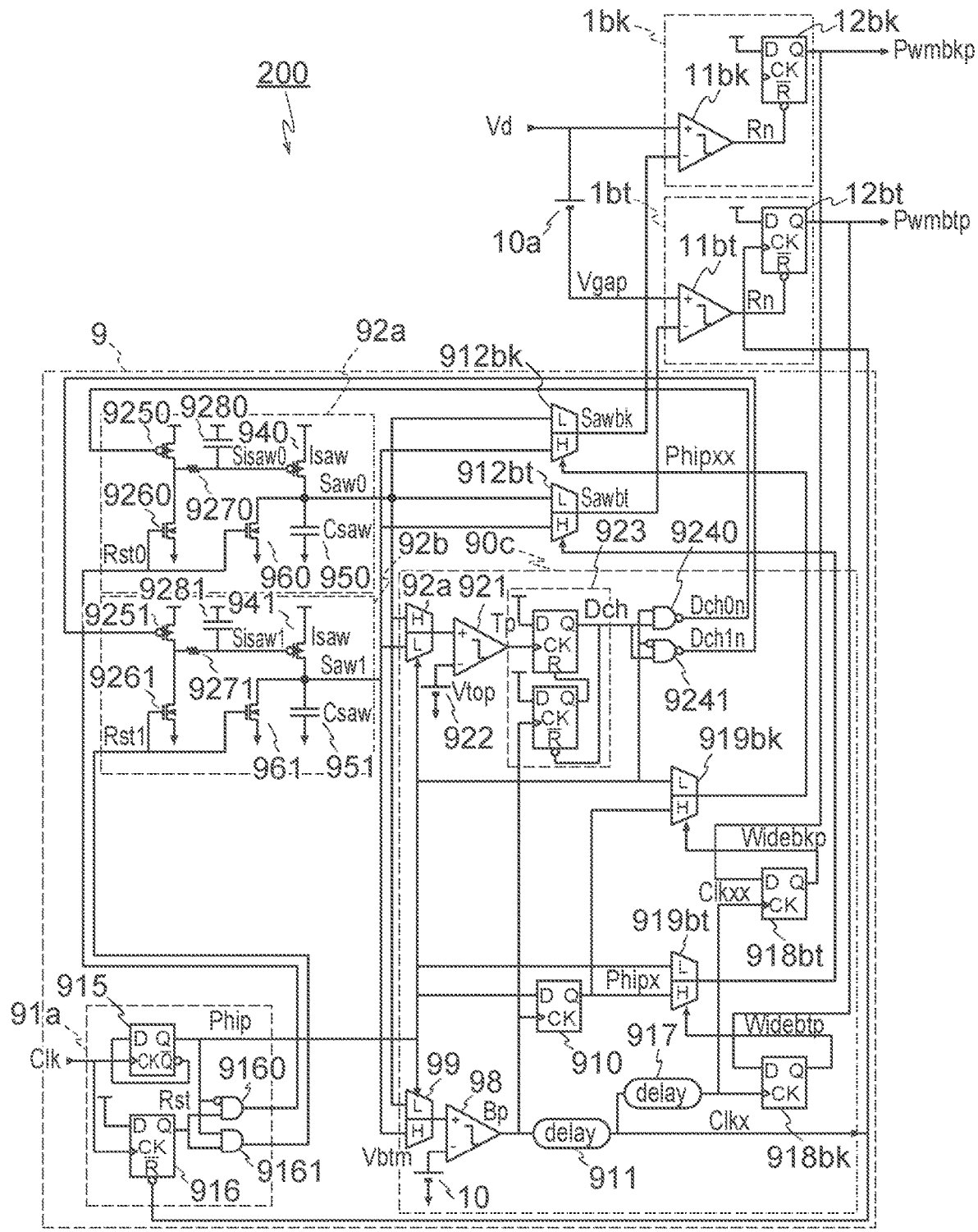
FIG. 16 is a diagram illustrating a detailed configuration example of a high-linearity sawtooth-wave generator, a buck PWM, and a boost PWM circuit according to the fifth embodiment.

FIG. 16 is a diagram illustrating a detailed configuration example of the sawtooth wave generator 9, the buck PWM circuit 1bk, and the boost PWM circuit 1bt according to the fifth embodiment. FIG. 16 further illustrates a wide-buck-pulse-width determination signal Widebkp, a wide-boost-pulse-width determination signal Widebtp, the boost duty-instruction voltage signal Vdbt, the buck PWM signal Pwmbkp, and the boost PWM signal Pwmbtp.

The buck PWM circuit 1bk is configured by a buck comparator 11bk and a buck flip-flop 12bk. Similarly, the boost PWM circuit 1bt is configured by a boost comparator 11bt and a boost flip-flop 12bt. The configurations and operations of both the PWM circuits are identical to that of the PWM circuit 1 according to the fourth embodiment, and therefore descriptions thereof are omitted. The boost comparator 11bt corresponds to a third detector and the boost flip-flip 12bt corresponds to a second PWM-signal output circuit.

Two systems of circuits, that is, a buck sawtooth-wave generation system and a boost sawtooth-wave generation system are mounted in the sawtooth wave generator 9. The buck sawtooth-wave generation system is configured by a buck wide-pulse-width determination flip-flop 918bk, a buck switch 919bk, and a selector 912bk. Similarly, the boost sawtooth-wave generation system is configured by a boost wide-pulse-width determination flip-flop 918bt, a boost switch 919bt, and a boost selector 912bt. The configurations and operations of both the systems are identical to those of the with-pulse-width determination flip-flop 918, the switch 919, and the selector 912 according to the fourth embodiment, and therefore descriptions thereof are omitted.

In a buck-boost switching power supply, when a potential relation between an input power and an output power is changed, a buck switching pulse width and a boost switching pulse width are each changed from 0% to 100%. It is important that a change immediately before elimination of a pulse or immediately before a full operation is smooth.

If the pulse width rapidly changes, there arises a problem of a rapid change or a periodical fluctuation of an output power-supply voltage, for example. As a measure against the problem, it is conceivable to limit the change amount of the pulse width to a range from 10% to 90%, for example. However, in a case where a voltage ratio between an input power supply and an output power supply is large, an unnecessary switching operation is caused, so that a conversion power efficiency is deteriorated.

As described above, according to the present embodiment, the amplitude of the sawtooth-wave signal Saw is switched to generate the buck PWM signal Pwmbkp for controlling the buck driver NMOS transistor 22 and the boost PWM signal Pwmbtp for controlling the boost driver NMOS transistor 25. Accordingly, it is possible to continuously control duties of the buck PWM signal Pwmbkp and the boost PWM signal Pwmbtp independently of each other in a wide range from 0% to 100%. Therefore, it is possible to smoothly switch a boost operation, a buck-boost operation, and a buck operation. As described above, also in a case where a potential relation between an input power supply and an output power supply fluctuates, it is possible to provide a buck-boost switching power supply that provides a high conversion power efficiency and operates stably.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A rectangular-wave-signal generating circuit comprising:
   a sawtooth-wave output circuit configured to generate and output a sawtooth-wave signal synchronized with a clock signal;
   a first detector configured to detect a first timing at which a voltage of the sawtooth-wave signal exceeds a bottom voltage;
   a second detector configured to detect a second timing at which a voltage of the sawtooth- wave signal exceeds a voltage of a first pulse-width instruction voltage signal; and
   a first PWM-signal output circuit configured to generate and output a first PWM signal based on a time difference between the first timing and the second timing,
   wherein the sawtooth-wave output circuit comprises a first sawtooth-wave output circuit configured to generate a first sawtooth-wave signal having a period that is twice a period of the clock signal, and a second sawtooth-wave output circuit configured to generate a second sawtooth- wave signal whose signal value overlaps a time-proportional range of the first sawtooth-wave signal and a phase of which is different from that of the first sawtooth-wave signal by 180 degrees,
   the first detector detects the first timing based on the first sawtooth-wave signal or the second sawtooth-wave signal, and
   the second detector detects the second timing based on the first sawtooth-wave signal or the second sawtooth-wave signal, whichever the detection of the first timing was based on.

2. A rectangular-wave-signal generating circuit comprising:
   a sawtooth-wave output circuit configured to generate and output a sawtooth-wave signal synchronized with a clock signal;
   a first detector configured to detect a first timing at which a voltage of the sawtooth-wave signal exceeds a bottom voltage;
   a second detector configured to detect a second timing at which a voltage of the sawtooth-wave signal exceeds a voltage of a first pulse-width instruction voltage signal; and
   a first PWM-signal output circuit configured to generate and output a first PWM signal based on a time difference between the first timing and the second timing,
   wherein the bottom voltage is set based on a time-proportional range of the sawtooth-wave signal, and a rising rate of the voltage of the sawtooth-wave signal exceeding the bottom voltage is in a predetermined range.

3. A rectangular-wave-signal generating circuit comprising:
   a sawtooth-wave output circuit configured to generate and output a sawtooth-wave signal synchronized with a clock signal;
   a first detector configured to detect a first timing at which a voltage of the sawtooth-wave signal exceeds a bottom voltage;
   a second detector configured to detect a second timing at which a voltage of the sawtooth-wave signal exceeds a voltage of a first pulse-width instruction voltage signal; and
   a first PWM-signal output circuit configured to generate and output a first PWM signal based on a time difference between the first timing and the second timing,
   wherein the first PWM-signal output circuit sets a minimum pulse width of the first PWM signal to 0 when the voltage of the first pulse-width instruction voltage signal is lower than the bottom voltage.

4. The rectangular-wave-signal generating circuit of claim 1, wherein
   the first detector and the second detector are circuits that are equivalent to each other in a signal response time, and
   a finite minimum pulse width of the first PWM signal is based on a signal response time of the first PWM-signal output circuit.

5. The rectangular-wave-signal generating circuit of claim 1, further comprising a first selector configured to switch and select one of the first sawtooth-wave signal and the second sawtooth-wave signal in accordance with a period of the clock signal, wherein
   the first detector detects the first timing based on one of the first sawtooth-wave signal and the second sawtooth-wave signal selected by the first selector.

6. The rectangular-wave-signal generating circuit of claim 1, further comprising a second selector configured to switch and select one of the first sawtooth-wave signal and the second sawtooth-wave signal in accordance with a period of the clock signal, wherein
   the second detector detects the second timing based on one of the first sawtooth-wave signal and the second sawtooth-wave signal selected by the second selector.

7. The rectangular-wave-signal generating circuit of claim 1, further comprising a second selector configured to switch and select one of time-proportional ranges of the first sawtooth-wave signal and the second sawtooth-wave signal in accordance with a period of the clock signal, and outputs the sawtooth-wave signal having high linearity.

8. The rectangular-wave-signal generating circuit of claim 7, wherein the second selector switches and selects one of the first sawtooth-wave signal and the second sawtooth-wave signal based on the first timing having been detected by the first detector.

9. The rectangular-wave-signal generating circuit of claim 5, wherein the first PWM-signal output circuit sets a Hi pulse-width duty of the first PWM signal to be 100% when the voltage of the first pulse-width instruction voltage signal is higher than a highest voltage of the sawtooth-wave signal output from the first selector.

10. The rectangular-wave-signal generating circuit of claim 8, further comprising a delay circuit configured to adjust a time interval between the first timing and the second timing.

11. The rectangular-wave-signal generating circuit of claim 1, further comprising a second selector configured to switch time-proportional ranges of the first sawtooth-wave signal and the second sawtooth-wave signal in accordance with a period of the clock signal to output the sawtooth-wave signal, wherein the second selector selects a range of the first sawtooth-wave signal or the second sawtooth-wave signal including a minimum value when a pulse width of the first PWM signal is smaller than a predetermined value, and selects time-proportional ranges of the first sawtooth-wave signal or the second sawtooth-wave signal when the pulse width of the first PWM signal is equal to or larger than a predetermined value.

12. The rectangular-wave-signal generating circuit of claim 1, further comprising:

a second selector configured to switch time-proportional ranges of the first sawtooth-wave signal and the second sawtooth-wave signal in accordance with a period of the clock signal to output the sawtooth-wave signal; and an adjuster configured to adjust voltage rising rates of the first sawtooth-wave signal and the second sawtooth-wave signal in such a manner that a difference between a timing at which the sawtooth-wave signal output from the second selector reaches a predetermined top voltage and a timing at which the sawtooth-wave signal reaches a highest voltage becomes a constant value.

13. The rectangular-wave-signal generating circuit of claim 1, further comprising:

a third detector configured to detect a third timing in accordance with a timing at which a voltage of the sawtooth-wave signal and a voltage of a second pulse-width instruction voltage signal match with each other; and a second PWM-signal output circuit configured to generate and output a second PWM signal in accordance with a time difference between the first timing and the third timing, wherein the sawtooth-wave output circuit comprises the third detector configured to detect the third timing based on the first sawtooth-wave signal or the second sawtooth-wave signal, whichever the detection of the first timing was based on.

14. A switching power supply comprising:

the rectangular-wave-signal generating circuit according to any one of claims 1 to 3 and 5 to 12;

a switching circuit portion connected to an input power voltage and configured to perform switching in response to the first PWM signal to output a voltage having a pulse-like waveform;

a smoothing circuit portion configured to convert a voltage having the pulse-like waveform into a direct-current voltage to output an output voltage; and an error amplifier circuit configured to output the first pulse-width instruction voltage signal based on a voltage difference between the output voltage and a reference voltage.

15. A switching power supply configured to perform a buck-boost operation, comprising:

the rectangular-wave-signal generating circuit according to claim 13;

a first switching element connected between an input power-supply terminal and one end of an inductor and configured to perform switching in response to the first PWM signal;

a second switching element connected between the other end of the inductor and a ground and configured to perform switching in response to the second PWM signal, the other end of the inductor being connected to an output terminal that outputs an output voltage;

a capacitor connected between the output terminal and a ground; and an error amplifier circuit configured to output the first pulse-width instruction voltage signal and the first pulse-width instruction voltage signal based on a voltage difference between the output voltage and a reference voltage.

* * * * *